(12) United States Patent
Masumoto

(10) Patent No.: US 11,806,903 B2
(45) Date of Patent: Nov. 7, 2023

(54) MANUFACTURING METHOD OF HOUSING FOR SEMICONDUCTOR DEVICE

(71) Applicant: Mitsubishi Electric Corporation, Tokyo (JP)

(72) Inventor: Hiroyuki Masumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 205 days.

(21) Appl. No.: 17/391,720

(22) Filed: Aug. 2, 2021

(65) Prior Publication Data

US 2022/0134616 A1 May 5, 2022

(30) Foreign Application Priority Data

Oct. 30, 2020 (JP) .................................. 2020-182918

(51) Int. Cl.
*B29C 45/14* (2006.01)
*H01L 21/48* (2006.01)
(Continued)

(52) U.S. Cl.
CPC .. *B29C 45/14426* (2013.01); *B29C 45/14065* (2013.01); *H01L 21/4817* (2013.01); *H01L 23/049* (2013.01); *H01L 23/3735* (2013.01); *H01L 24/32* (2013.01); *H01L 24/48* (2013.01); *H01L 24/73* (2013.01); *H01L 25/072* (2013.01); *B29L 2031/3406* (2013.01); (Continued)

(58) Field of Classification Search
CPC ........ B29C 45/14426; B29C 45/14065; H01L 21/4817; H01L 23/049
See application file for complete search history.

(56) References Cited

U.S. PATENT DOCUMENTS 6,527,989 B1 * 3/2003 Onoda ............... B29C 45/14639
264/277
2008/0001278 A1 1/2008 Matsumoto
(Continued)

FOREIGN PATENT DOCUMENTS

JP 2008-010656 A 1/2008
JP 2014-103284 A 6/2014
(Continued)

OTHER PUBLICATIONS

Mechanical translation of KR 20160100861 A dated Aug. 2016. (Year: 2016).*

*Primary Examiner* — Robert B Davis
(74) *Attorney, Agent, or Firm* — Studebaker & Brackett PC

(57) ABSTRACT

Each of a plurality of terminals has a first portion and a second portion being a connection target for a semiconductor element. A manufacturing method of a housing includes a first step arranging, for a lower mold provided with a plurality of holes each of which is a target into which the first portion is inserted, a nest having a third portion covering at least one of the holes, a second step arranging, for the lower mold with the nest being arranged therein, the plurality of terminals by inserting the first portion into the hole not covered by the third portion, a third step arranging an upper mold on the lower mold with the nest and the plurality of terminals being arranged therein, and a fourth step, which is executed after the third step, obtaining the housing by performing resin molding using the lower mold and the upper mold.

8 Claims, 23 Drawing Sheets

(51) Int. Cl.
*H01L 23/04* (2006.01)
*H01L 23/049* (2006.01)
*H01L 23/373* (2006.01)
*H01L 23/00* (2006.01)
*H01L 25/07* (2006.01)
*B29L 31/34* (2006.01)

(52) U.S. Cl.
CPC ............ *H01L 2224/32225* (2013.01); *H01L 2224/48137* (2013.01); *H01L 2224/48225* (2013.01); *H01L 2224/73265* (2013.01); *H01L 2924/1306* (2013.01); *H01L 2924/13055* (2013.01); *H01L 2924/15787* (2013.01); *H01L 2924/1616* (2013.01); *H01L 2924/1632* (2013.01)

(56) References Cited

U.S. PATENT DOCUMENTS

| | | | | |
|---|---|---|---|---|
| 2012/0238149 | A1* | 9/2012 | Tate | B29C 45/14065 439/660 |
| 2014/0198454 | A1* | 7/2014 | Yuan | H01L 25/162 361/720 |
| 2016/0351459 | A1* | 12/2016 | Weatherspoon | H01L 23/08 |
| 2020/0227846 | A1* | 7/2020 | Lin | H01R 13/405 |

FOREIGN PATENT DOCUMENTS

| | | | | |
|---|---|---|---|---|
| KR | 20160100861 A | * | 8/2016 | ........... H01L 23/049 |
| WO | WO-2018178200 A1 | * | 10/2018 | ........... H01R 13/405 |

* cited by examiner

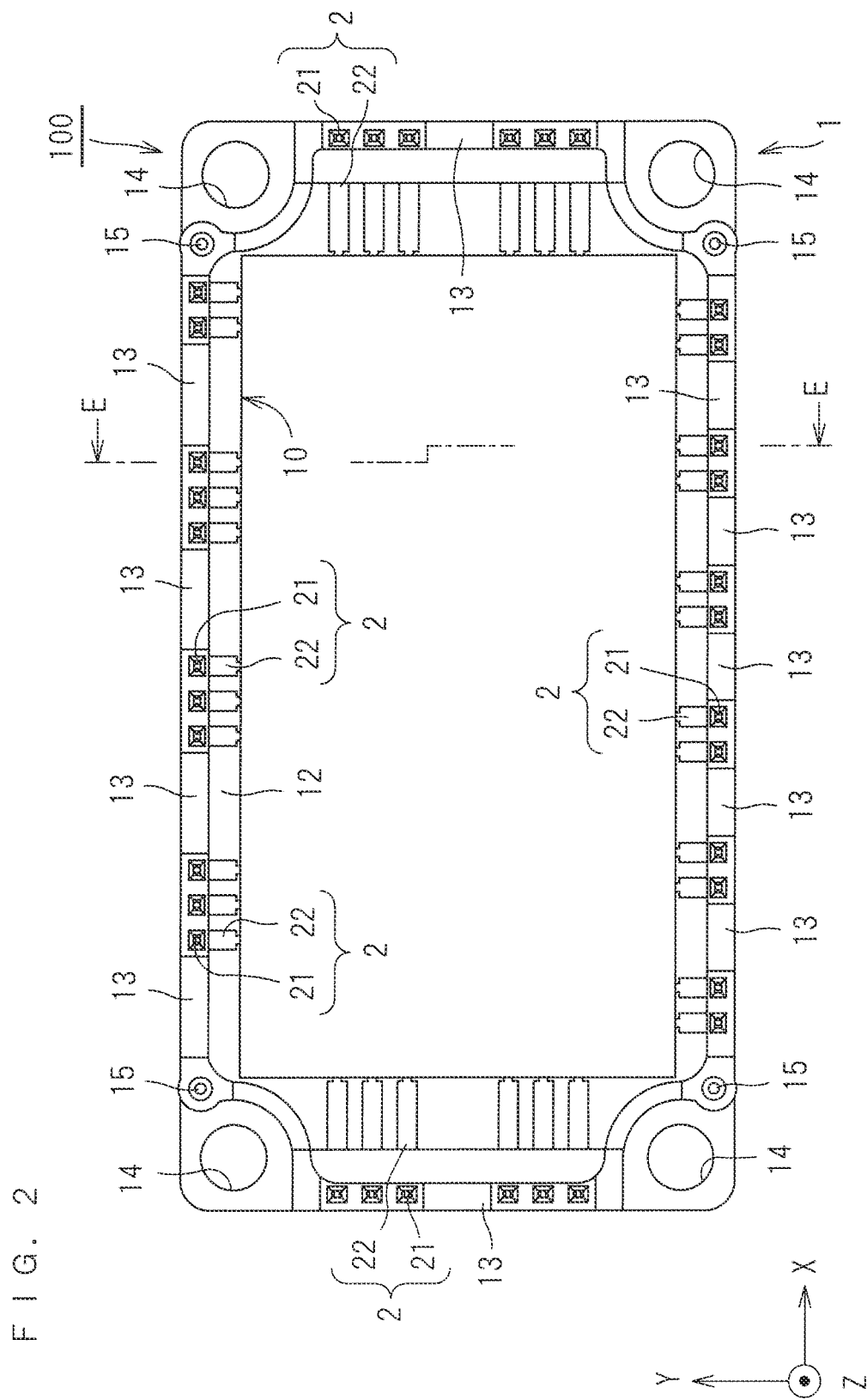
F I G. 2

FIG. 3
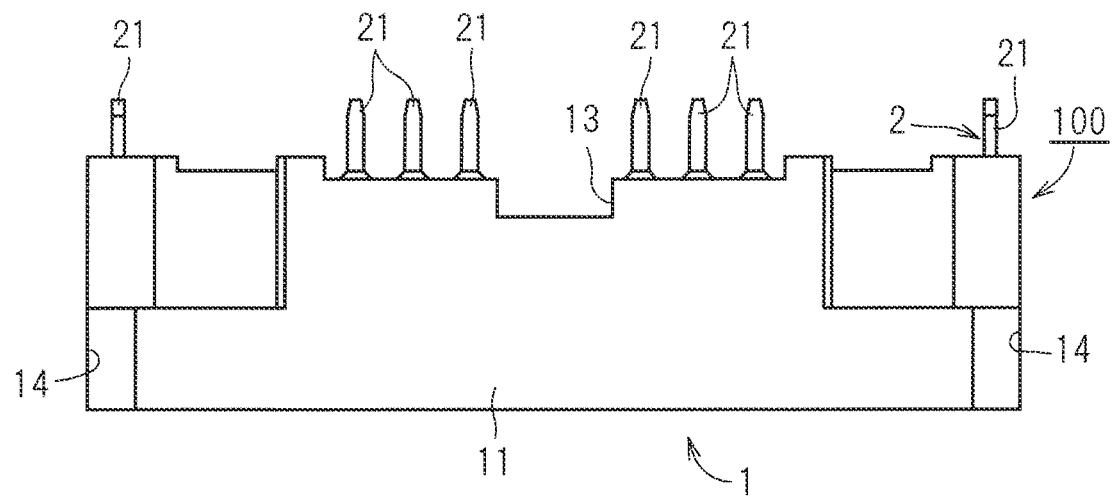
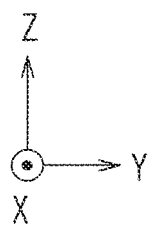

FIG. 7
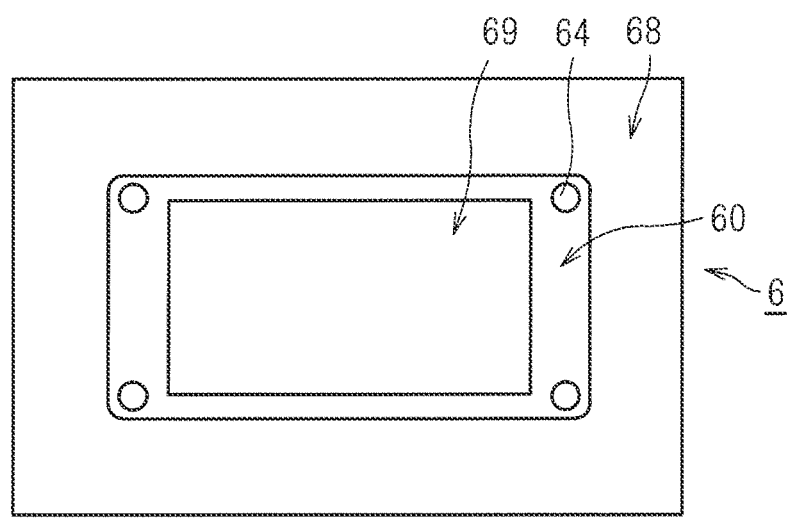
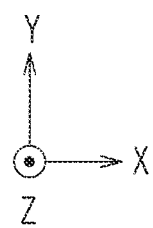

ced with the nest and the terminals being arranged therein. The fourth step is executed after the third step. In the fourth step, resin molding is performed using the lower mold and the upper mold to obtain the housing.

The method of manufacturing the housing of a semiconductor device according to the present disclosure contributes to insert molding with a high degree of freedom in the arrangement of the terminals provided in the housing.

These and other objects, features, aspects and advantages of the present invention will become more apparent from the following detailed description of the present invention when taken in conjunction with the accompanying drawings.

MANUFACTURING METHOD OF HOUSING FOR SEMICONDUCTOR DEVICE

BACKGROUND OF THE INVENTION

Field of the Invention

The present disclosure relates to a manufacturing method of a housing for a semiconductor device.

Description of the Background Art

A package for a semiconductor device including a base plate, a semiconductor mounting substrate mounted on the base plate, a mother case as a housing fixed to the base plate, fixing members, screw terminals, and pin terminals is known (for example, see Japanese Patent Application Laid-Open No. 2008-10656 below).

Japanese Patent Application Laid-Open No. 2008-10656 exemplifies the following technique: the mother case has an opening; the screw terminals and the pin terminals are fixed to the peripheral edge constituting the opening by using the fixing members; the screw terminals and the pin terminals are fixed with the fixing members of some of fixing positions of a plurality of fixing positions; various packages are constructed by changing the fixing positions; and the screw terminals can be manufactured using outsert molding.

A technique for forming an outer case having a central opening by integrating an electrically insulating resin material and external terminals electrically connected to an electrode of a power semiconductor chip by insert molding has also been known (for example, see Japanese Patent Application Laid-Open No. 2014-103284).

SUMMARY

Compared with outsert molding, insert molding is less likely to allow moisture to enter the inside of the semiconductor device, and has high reliability of hygroscopic resistance. According to the conventional insert molding, the degree of freedom in arranging the terminals is small. In the conventional insert molding, when a plurality of types of arrangements are adopted for terminals, a plurality of types of molds are prepared. Such preparation is disadvantageous in terms of when producing other varieties in small amount. The present disclosure provides a technique for insert molding with a high degree of freedom in the arrangement of terminals provided in a housing.

According to the present disclosure, a manufacturing method of a housing of a semiconductor device is a manufacturing method of a housing provided in a semiconductor device together with a semiconductor element. The housing includes a frame and a terminal insert-molded together with the frame. The terminal has a first portion and a second portion. The second portion is a connection target for the semiconductor element. A plurality of the terminals are provided.

The method includes a first step to a fourth step. In the first step, a nest is arranged in a lower mold. A hole is provided in the lower mold. The hole is a target into which the first portion is inserted. The nest has a third portion. A plurality of the holes are provided. The third portion covers at least one of the holes.

In the second step, for the lower mold with the nest being arranged therein, the terminals are arranged by inserting the first portion into the hole not covered by the third portion. In the third step, an upper mold is arranged on the lower mold

BRIEF DESCRIPTION OF THE DRAWINGS

FIG. 2 is a plan view illustrating the housing obtained by the manufacturing method according to the present disclosure;

FIG. 3 is a side view illustrating the housing obtained by the manufacturing method according to the present disclosure;

FIG. 7 is a plan view illustrating an upper mold adopted in the manufacturing of the housing;

DESCRIPTION OF THE PREFERRED EMBODIMENTS

<Description of Configuration>

Figure 1:
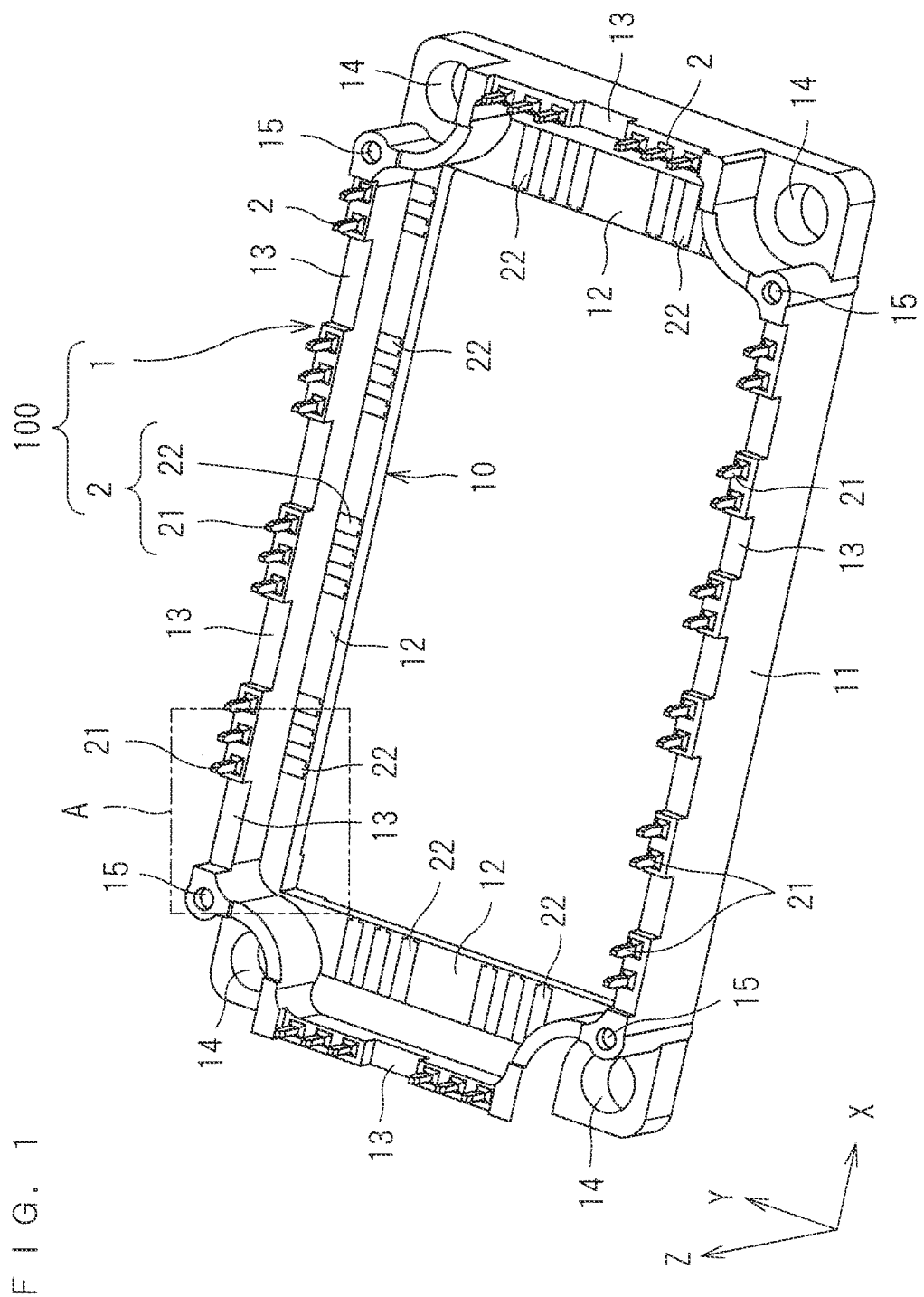
FIG. 1 is a perspective view illustrating a housing obtained by the manufacturing method according to the present disclosure.

FIG. 1 is a perspective view illustrating a housing 100 obtained by the manufacturing method according to the present disclosure. FIG. 2 is a plan view illustrating the housing 100. FIG. 3 is a side view illustrating the housing 100.

The housing 100 has a frame 1 and a plurality of terminals 2. The terminals 2 are insert-molded together with the frame 1 and the housing 100 is obtained thereby.

The material of frame 1 is an insulating resin. The frame 1 has a wall 11 and a bottom 12. The wall 11 has an annular shape. Each of the terminals 2 has a portion 21 and a portion 22. Each of the terminals 2 bends at a portion where the portion 21 and the portion 22 are connected. In the housing 100, the portions 21 are arranged in parallel.

Directions X, Y, Z are introduced for the convenience of the following description. The direction Z is adopted in the direction toward which the portion 21 extends when viewed from the portion 22. For example, the portion 22 extends from portion 21 in a direction perpendicular to the direction Z. The annular shape taken by the wall 11 has two sides parallel to the direction X and two sides parallel to the direction Y when viewed along the direction Z. The directions X and Y are orthogonal to each other, and both are orthogonal to the direction Z. The directions X, Y, and Z correspond to the so-called right-hand coordinate system.

The bottom 12 has an annular shape when viewed along the direction Z. Holes 14 are opened at the portions where the bottom 12 bends. The holes 14 penetrate through the bottom 12 along the direction Z. Fasteners, such as nuts, penetrate through the holes 14. The fasteners fasten the housing 100 to the heat radiation plate 8 (see FIG. 18) described later.

The bottom 12 has an inner surface 10 parallel to the direction Z. The inner surface 10 has a rectangular shape when viewed along the direction Z. The wall 11 extends along the direction Z on the direction Z side with respect to the bottom 12. The wall 11 is located outside the inner surface 10 and inside the holes 14 when viewed along the direction Z. Each boundary between two adjacent sides of the wall 11 is recessed toward the inner surface 10 side than the two sides. Near the holes 14, the wall 11 has holes 15 on the direction Z side. The holes 15 are used for screwing a printed circuit board (not shown) to the housing 100.

Portions 22 are exposed on the direction Z side surface of the bottom 12. Each tip of the portions 22 is exposed on the inner surface 10. Each portion 21 is exposed on the direction Z side surface of the bottom 11.

The wall 11 has recessed portions 13 that open in the direction Z side. Terminals 2 are not arranged in the recessed portions 13, so the portions 21 are not exposed in the recessed portions 13.

Figure 4:
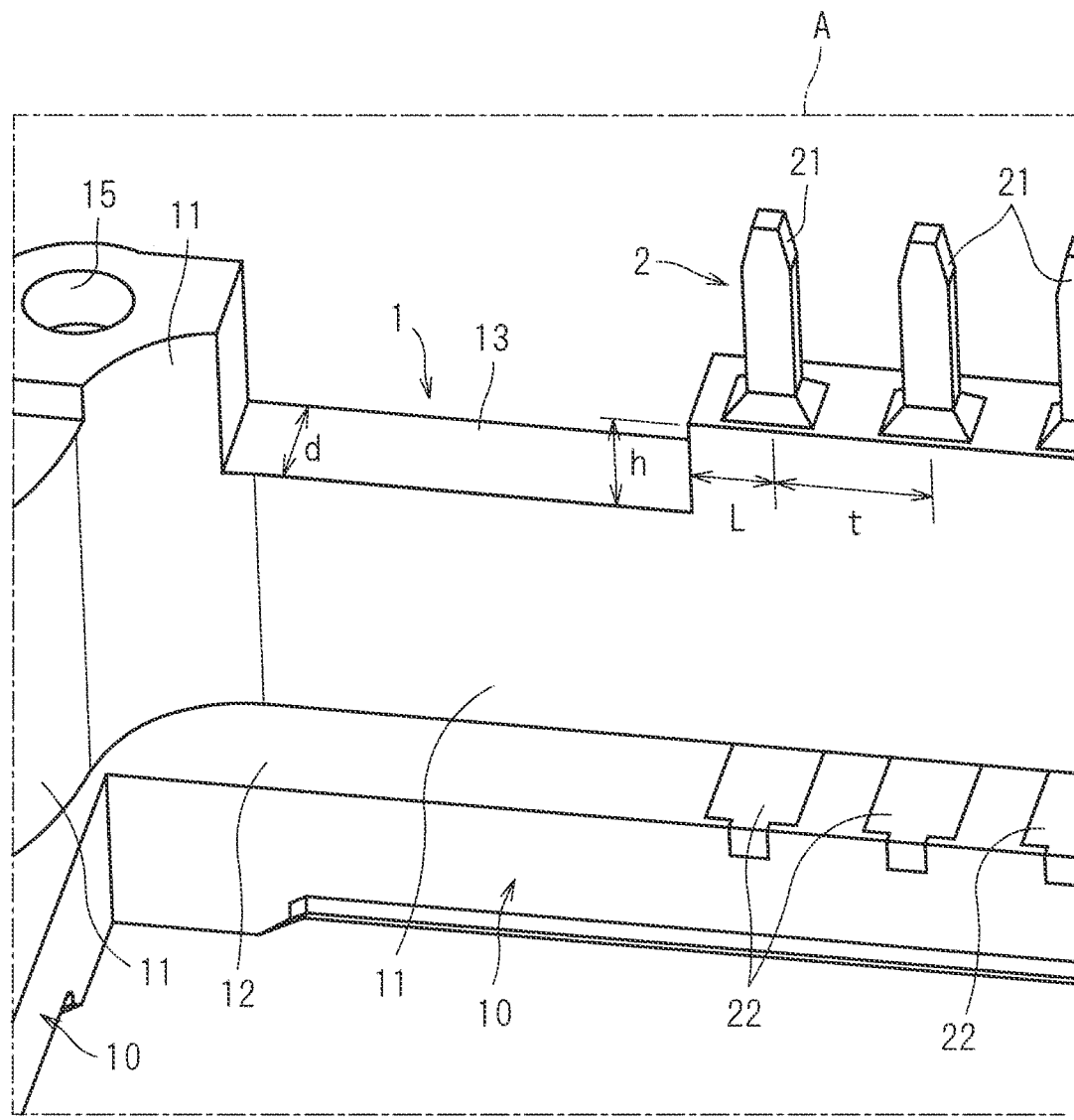
FIG. 4 is an enlarged view illustrating a part of the housing obtained by the manufacturing method according to the present disclosure.

FIG. 4 is an enlarged view illustrating a part of the housing 100. FIG. 4 illustrates an enlarged range A in FIG. 1. For convenience of later description, the thickness d of the wall 11, the depth h of the recessed portion 13, the distance L, and the pitch t are introduced.

The depth h is a distance between the surface of the recessed portion 13 on the direction Z side and the surface of the wall 11 on which the recess 13 is not provided on the direction Z side. The distance L is a distance between the recessed portion 13 and the position of a portion 21 closest to the recessed portion 13. The pitch t is a distance between a pair of portions 21 that are arranged adjacent to each other without interposing the recessed portion 13 therebetween.

<Manufacturing Process>

Figure 5:
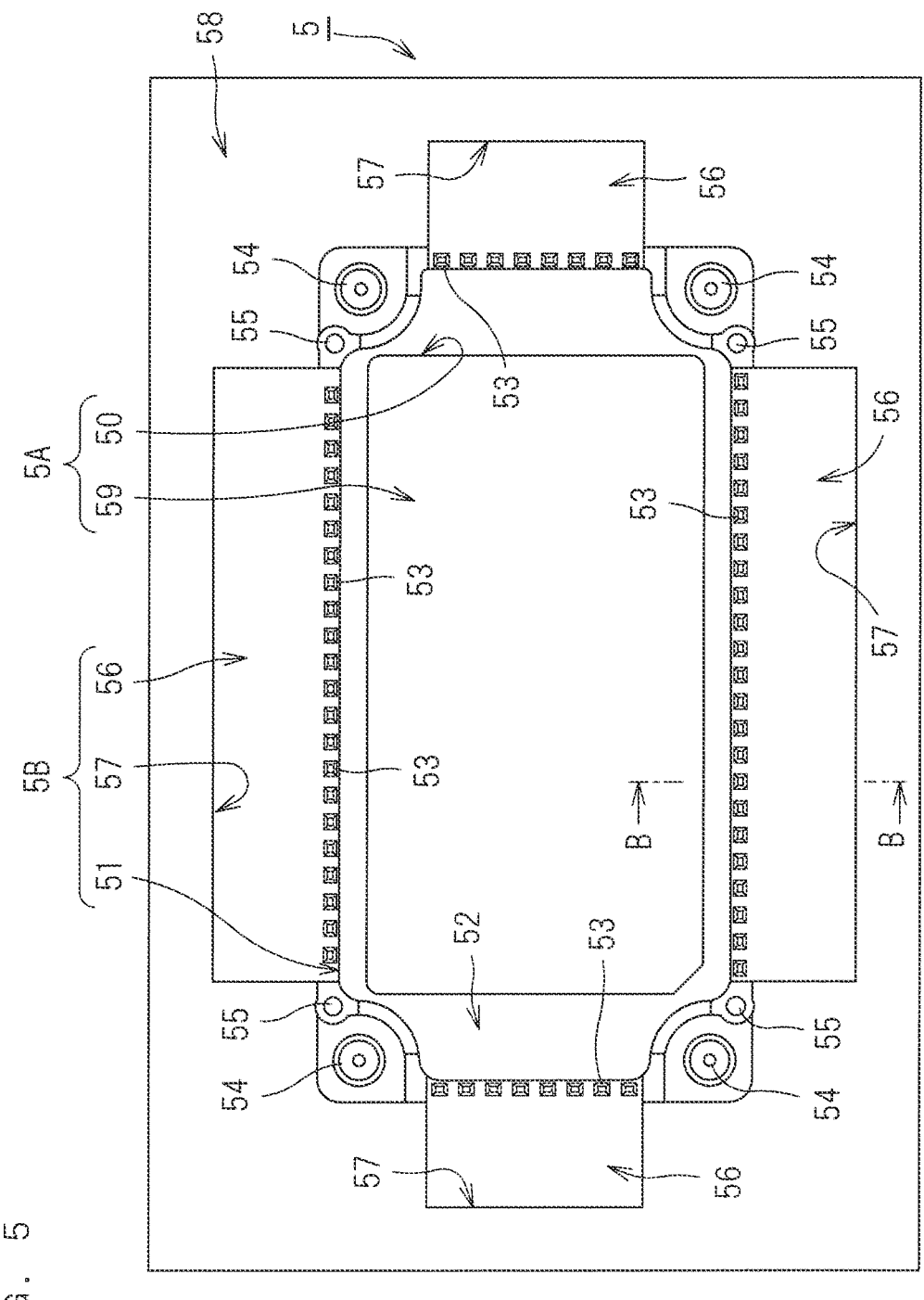
FIG. 5 is a plan view illustrating a lower mold adopted in the manufacturing of the housing.
Figure 6:
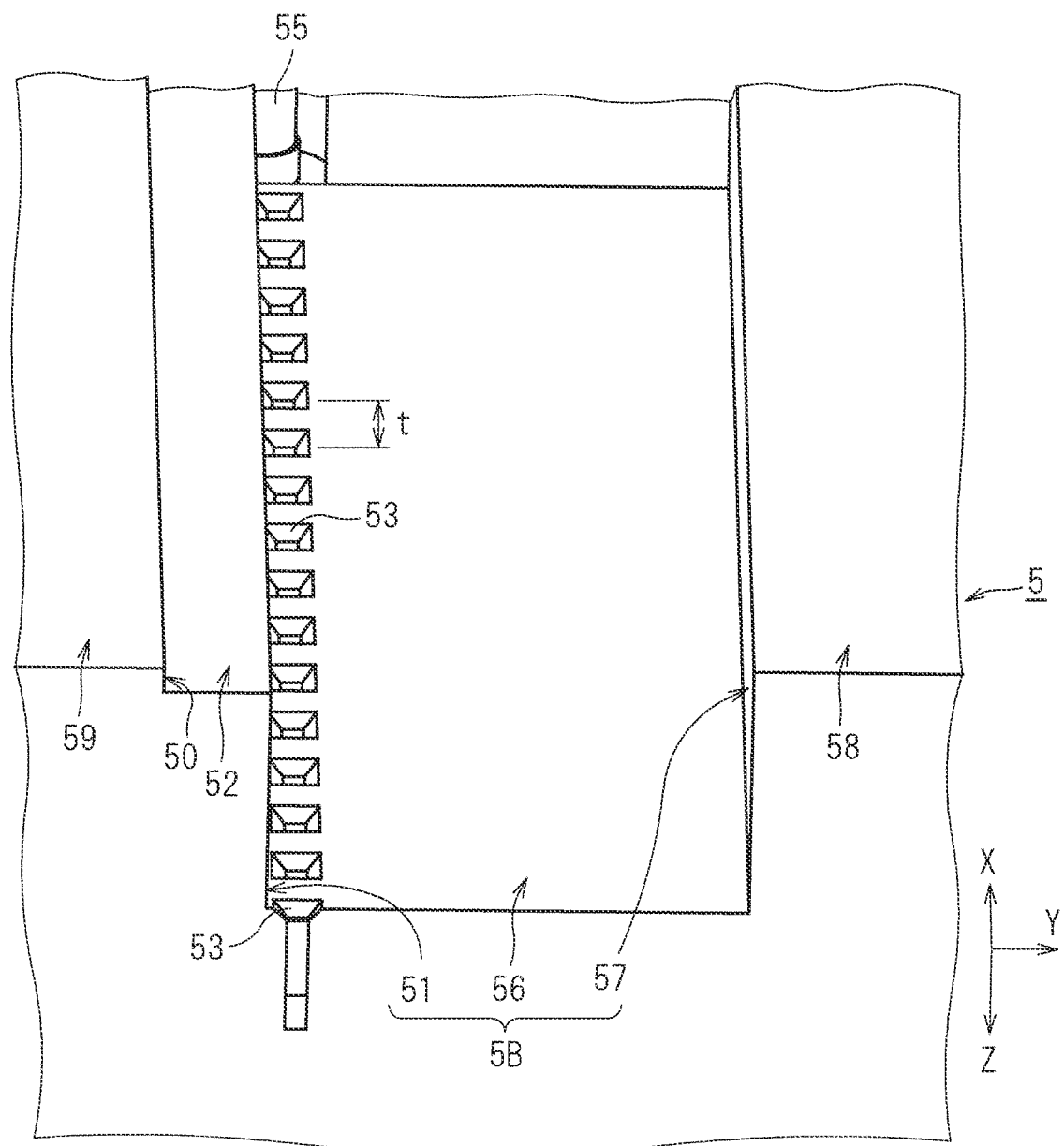
FIG. 6 is a perspective view partially illustrating the lower mold.

FIG. 5 is a plan view illustrating the lower mold 5 used for manufacturing the housing 100. FIG. 6 is a perspective view partially illustrating the lower mold 5. In FIG. 6, the cross section at the position BB in FIG. 5 appears on the front side of the sheet of paper.

The directions X, Y, and Z additionally shown in FIGS. 5 and 6 correspond to the directions X, Y, and Z additionally shown in FIGS. 1 to 4 illustrating the housing 100.

The lower mold 5 has upper surfaces 58 and 59 parallel to each other. In FIGS. 5 and 6, the upper surfaces 58 and 59 are perpendicular to the direction Z. The lower mold 5 has columns 54 and 55 parallel to each other. Both the columns 54 and 55 extend along the direction Z.

Excluding manufacturing tolerances, the end surface of the column 54 on the opposite side of the direction Z (hereinafter referred to as the "upper end surface"), the upper end surface of the column 55, and the upper surfaces 58 and 59 are on the same plane. Excluding manufacturing tolerances, in direction Z, the upper end surface of the column 54, the upper end surface of the column 55, the position of the upper surface 58, and the position of the upper surface 59 coincide with each other.

The lower mold 5 has upper surfaces 52 and 56. For example, the upper surfaces 52 and 56 are both parallel to the upper surfaces 58 and 59. The upper surface 52 is located on the direction Z side than the upper surfaces 58 and 59. The upper surfaces 56 are located on the direction Z side than the upper surface 52.

The lower mold 5 has side surfaces 50, 51, and 57. For example, the side surfaces 50, 51, and 57 are all parallel to the direction Z.

The side surface 50 is an annular surface connecting the upper surfaces 59 and 52. The upper surface 59 and the side surface 50 can be seen that they form a convex portion 5A protruding in a direction opposite to the direction Z (hereinafter, also referred to as "direction (−Z)") with respect to the upper surface 52.

The side surface 51 is an annular surface connecting the upper surfaces 52 and 56. The side surfaces 57 are surfaces connecting the upper surface 58 and the upper surfaces 56. It can be seen that the side surfaces 51 and 57 and the upper surface 56 form a recessed portion 5B that is depressed in the direction Z with respect to the upper surfaces 58 and 59 and opens in the opposite side of the direction Z.

The lower mold 5 shows a plurality of holes 53 that are opened on the upper surface 56 and arranged along the side surface 51. The holes 53 extend along the direction Z. The holes 53 do not extend through the lower mold 5. Excluding manufacturing tolerances, the spacing between a pair of adjacent holes 53 coincides with the pitch t. The holes 53 are the targets into which the portions 21 are inserted.

FIG. 7 is a plan view illustrating the upper mold 6. The upper mold 6 is used together with the lower mold 5 to manufacture the housing 100. The directions X, Y, and Z additionally shown in FIG. 7 correspond to the directions X, Y, and Z additionally shown in FIGS. 1 to 4 illustrating the housing 100.

The upper mold 6 has flat surfaces 64, 68 and 69. Excluding manufacturing tolerances, the positions of surfaces 64, 68, 69 in direction Z coincide with each other. In plan view, the surface 69 here is surrounded by the surface 68 when viewed along the direction (−Z). An annular recessed portion 60 is formed between the surfaces 68 and 69, which is recessed in the direction (−Z) side than the surfaces 68 and 69. The surfaces 64 can be seen as surfaces which the convex portions protruding in the direction Z in the concave portion 60 shows on the direction Z side. The recessed portion 60 can be seen that it opens in the direction Z.

When molding using the upper mold 6 and the lower mold 5, the columns 54 and the surfaces 64 are in contact with each other, the upper surface 59 and the surface 69 are in contact with each other, and the upper surface 58 and the surface 68 are in contact with each other.

The resin introduced in the molding is introduced in the direction Z side of the recessed portion 60. However, in order to avoid complication of drawing, drawing of a hole (gate) for injecting resin in the upper mold 6 or the lower mold 5 is omitted. No resin is molded at the position corresponding to the upper surface 59, the bottom 12 reflecting the shape of the upper surface 52 and having the inner surface 10 reflecting the shape of the side surface 50 is obtained. No resin is introduced into columns 54 and 55. This forms the holes 14 and 15.

Figure 8:
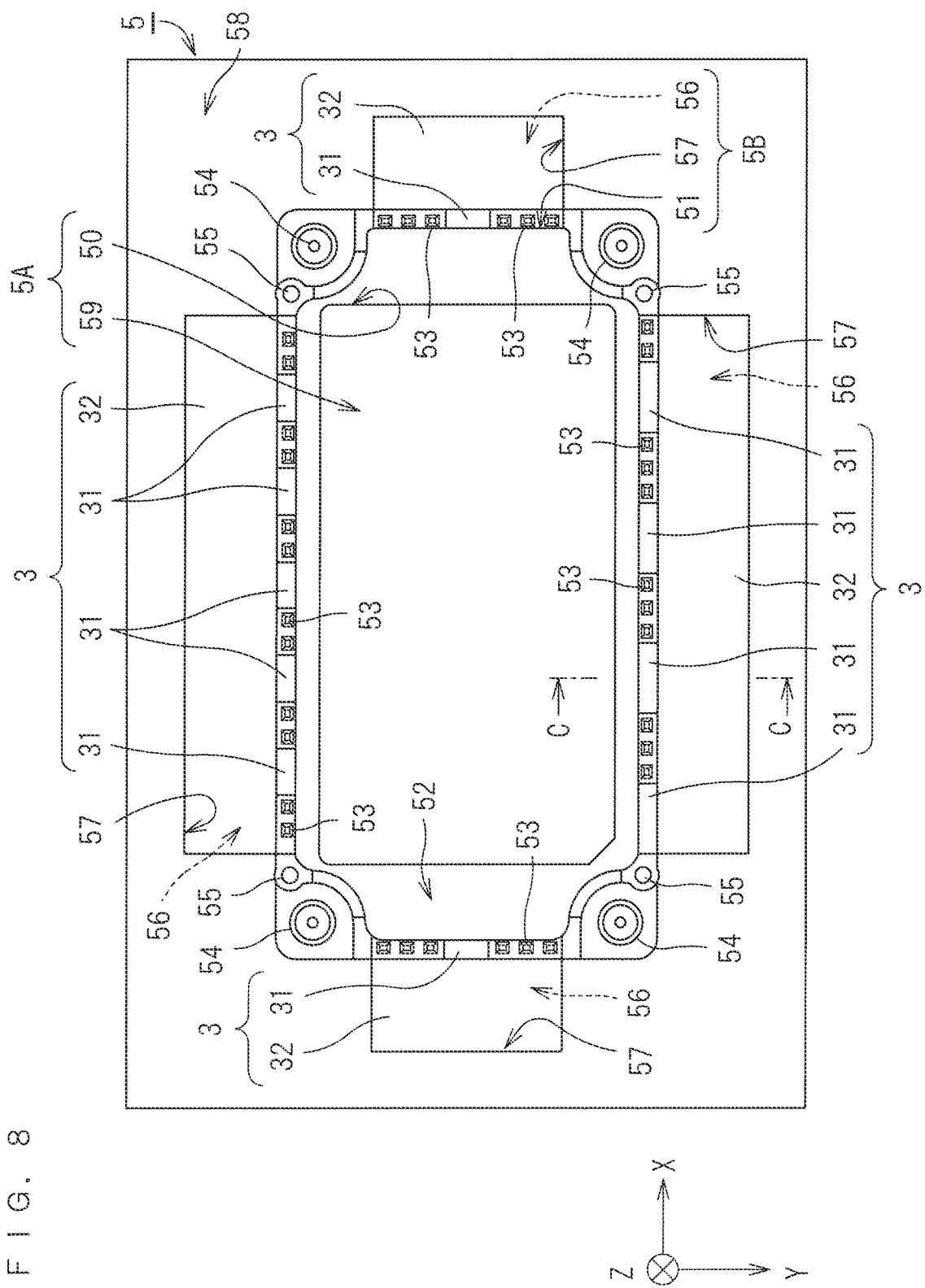
FIG. 8 is a plan view illustrating the lower mold and nests.
Figure 9:
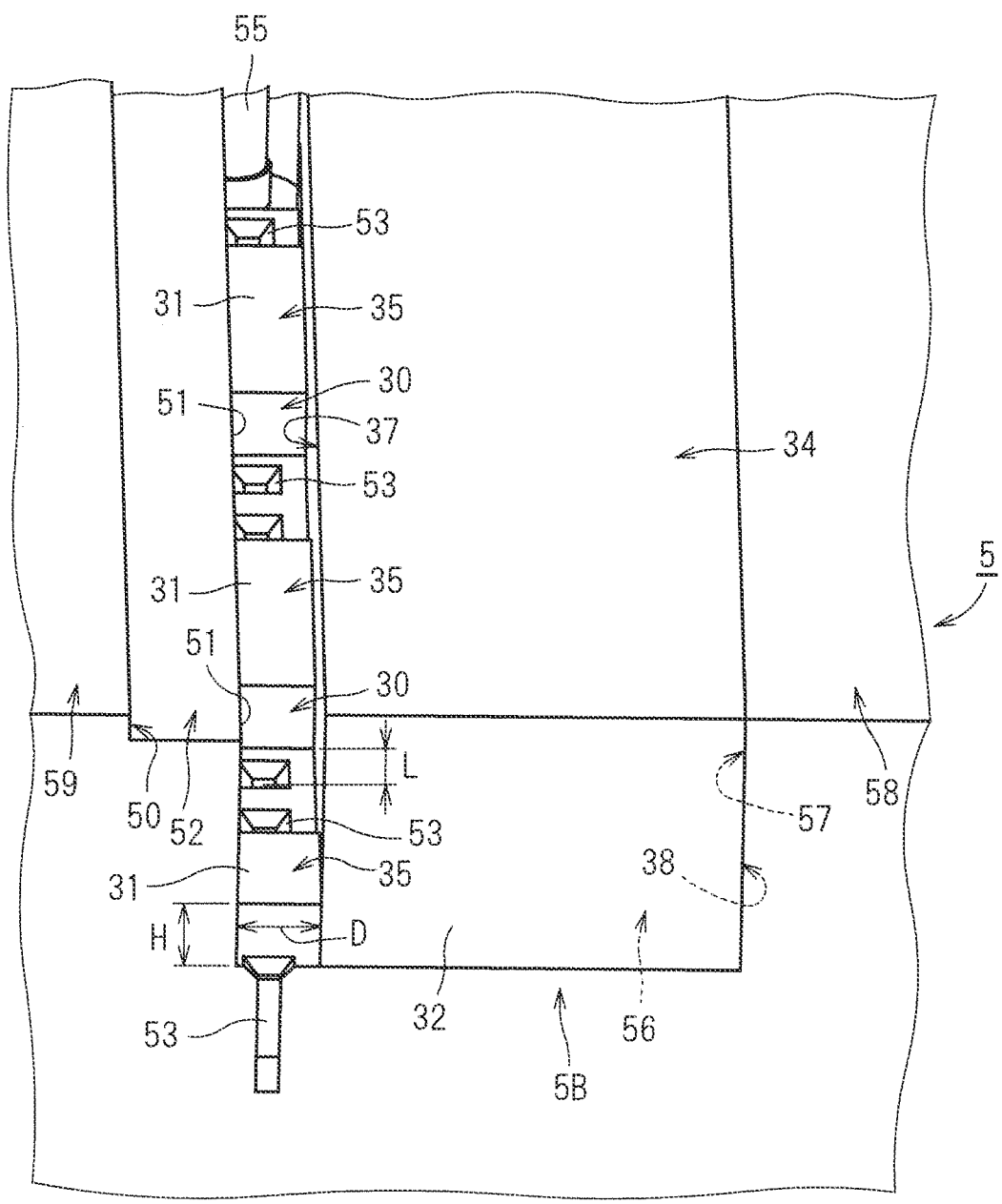
FIG. 9 is a perspective view partially illustrating the lower mold and the nest.

FIG. 8 is a plan view illustrating the lower mold 5 and nests 3. The nest 3 is also adopted in the manufacture of the housing 100. FIG. 9 is a perspective view partially illustrating the lower mold 5 and the nest 3. In FIG. 9, the cross section at the position CC in FIG. 8 appears on the front side of the sheet of paper. The directions X, Y, and Z additionally shown in FIGS. 8 and 9 correspond to the directions X, Y, and Z additionally shown in FIGS. 1 to 4 illustrating the housing 100.

Figure 10:
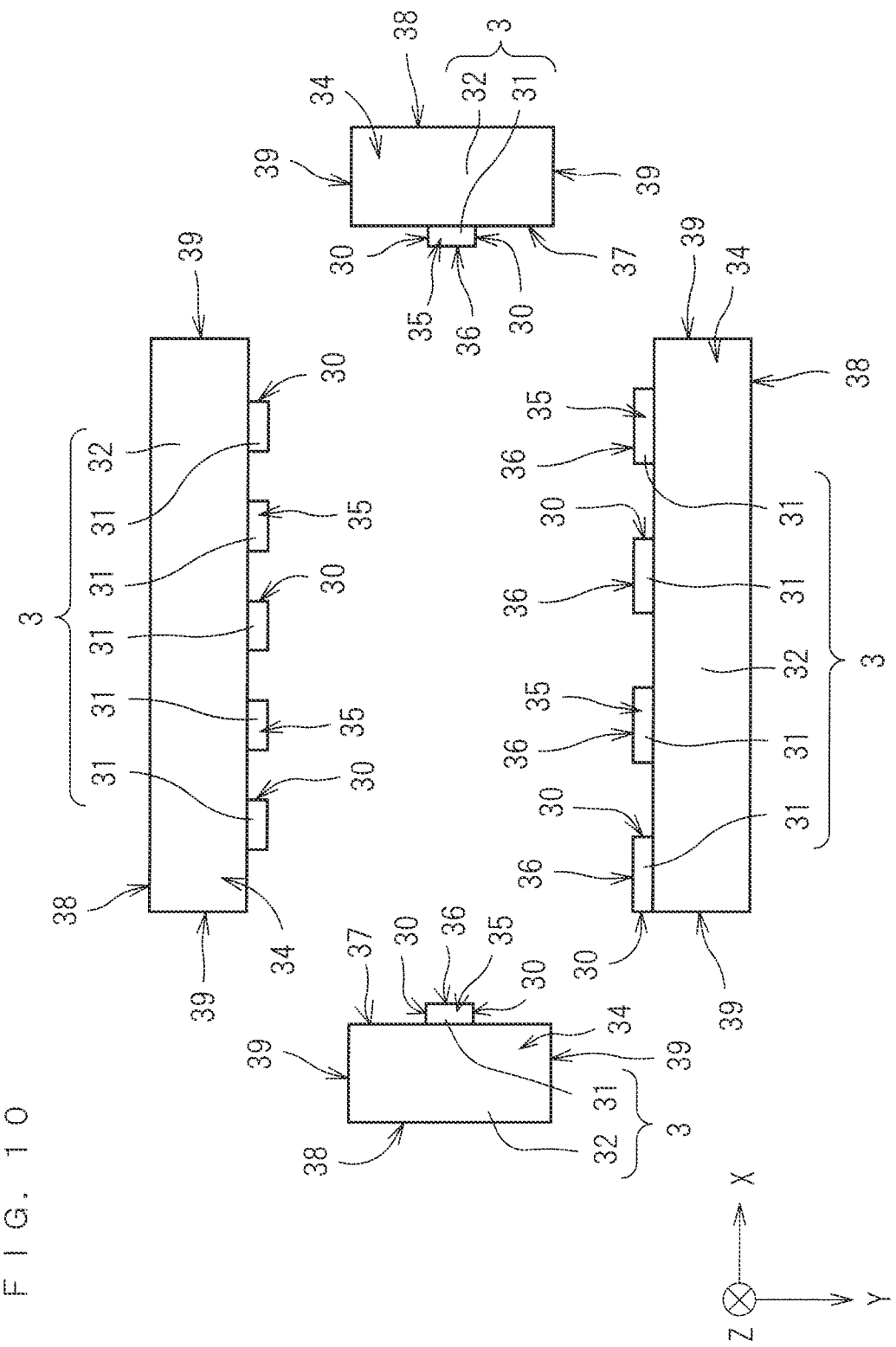
FIG. 10 is a plan view illustrating the nests.
Figure 11:
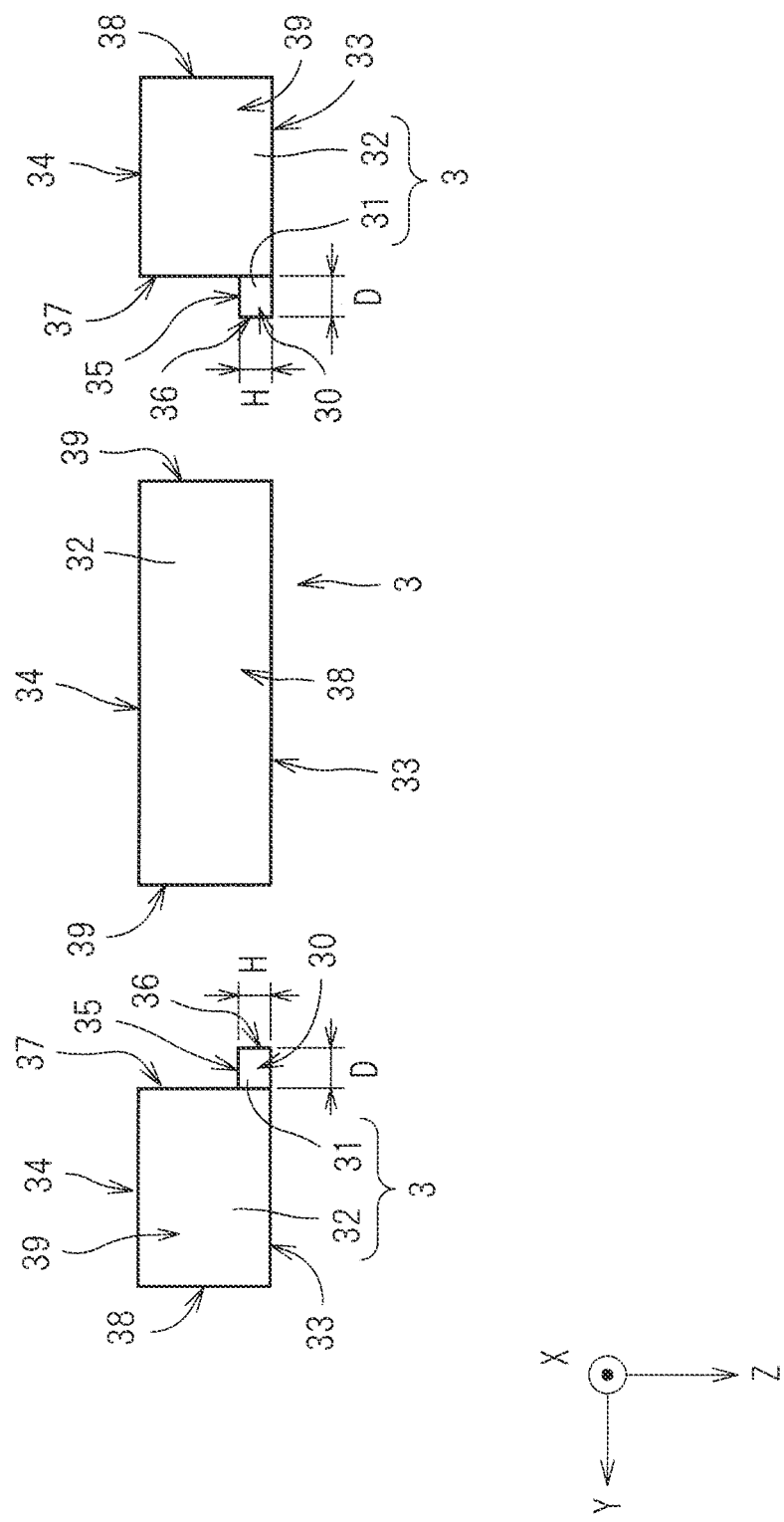
FIG. 11 is a side view illustrating the nests.

FIG. 10 is a plan view illustrating the nests 3. FIG. 11 is a side view illustrating the nests 3. The direction Z additionally shown in FIGS. 10 and 11 corresponds to the direction Z additionally shown in FIGS. 1 to 4 illustrating the housing 100.

The nest 3 fits into the recessed portion 5B. FIGS. 10 and 11 illustrate the nests 3 arranged in the state illustrated in FIG. 8. The nest 3 has a bottom surface 33, upper surfaces 34 and 35, side surfaces 36, 37, and 38, and end surfaces 30 and 39. The nest 3 has a portion 31 and a portion 32. The portion 31 and the portion 32 are connected to each other.

The bottom surface 33 is a flat surface that appears in both the portion 31 and the portion 32. The bottom surface 33 comes into contact with the upper surface 56 when the nest 3 fits into the recessed portion 5B.

The upper surface 34 is a flat surface appearing in the portion 32. The upper surface 34 is located on the same plane as the upper surfaces 58 and 59 when the nest 3 fits into the recessed portion 5B.

The upper surface 35 is a flat surface appearing in the portion 31 and parallel, for example, with the upper surface 34. The distance between the upper surface 35 and the bottom surface 33 can be seen as the length of the portion 31 along the direction Z (hereinafter also simply referred to as the "thickness" of the portion 31). Excluding manufacturing tolerances, the thickness H of the portion 31 coincides with the depth h when the upper surfaces 34 and 35 are in parallel.

The side surface 36 is a flat surface appearing in the portion 31. The side surface 36 comes into contact with the side surface 51 when the nest 3 fits into the recessed portion 5B.

The side surface 37 is a flat surface appearing in the portions 32 and parallel, for example, with the side surface 36. The distance between the side surface 36 and the side surface 37 can be seen as the length by which the portion 31 protrudes from the portion 32 (hereinafter, also simply referred to as the "protruding length" of the portion 31). Excluding manufacturing tolerances, the protruding length D of the portion 31 coincides with the thickness d when the side surfaces 36 and 37 are in parallel.

The side surface 38 is a flat surface appearing in the portion 32 and parallel, for example, with the side surface 36. The side surface 38 comes into contact with the side surface 57 when the nest 3 fits into the recessed portion 5B.

The end surfaces 39 are flat surfaces appearing in the portion 32. The end surfaces 30 are flat surfaces appearing in the portion 31. The end surfaces 39 come into contact with the side surface 57 when the nest 3 fits into the recessed portion 5B. The end surfaces 39 and 30 are all perpendicular to the bottom surface 33, the upper surfaces 34 and 35, and the side surfaces 36, 37, and 38, for example. For example, each of the portion 31 and the portion 32 shows the shape of a rectangular parallelepiped.

In FIGS. 10 and 11, the case where each of the portions 31 and the portions 32 shows the shape of a rectangular parallelepiped is illustrated as an example. In FIG. 11, the thickness H of the portion 31 and the protruding length D of the portion 31 are shown.

The portion 31 covers one or more holes 53 on the opposite side of direction Z. The portion 31 contacts both the side surface 51 and the upper surface 56.

When the nest 3 fits into the recessed portion 5B, the side surface 38 and end surfaces 39 are in contact with the side surface 57, the bottom surface 33 is in contact with the upper surface 56, the side surface 36 is in contact with the side surface 51, and the portion 32 function to fix the positions of the portion 31. When one nest 3 has a plurality of portions 31, the portion 32 can be seen as having a function of connecting these portions 31.

Figure 12:
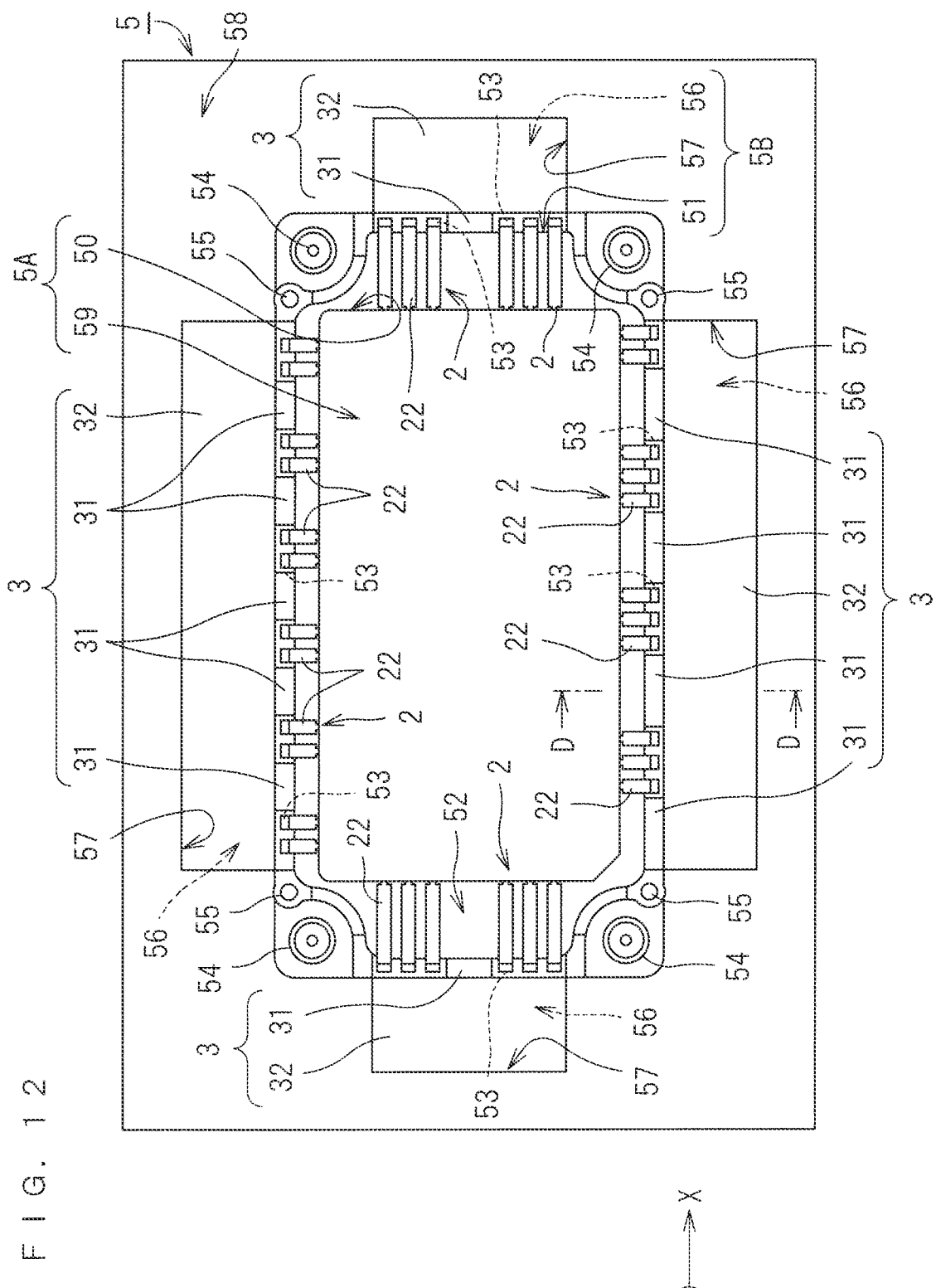
FIG. 12 is a plan view illustrating the lower mold, the nests, and terminals.
Figure 13:
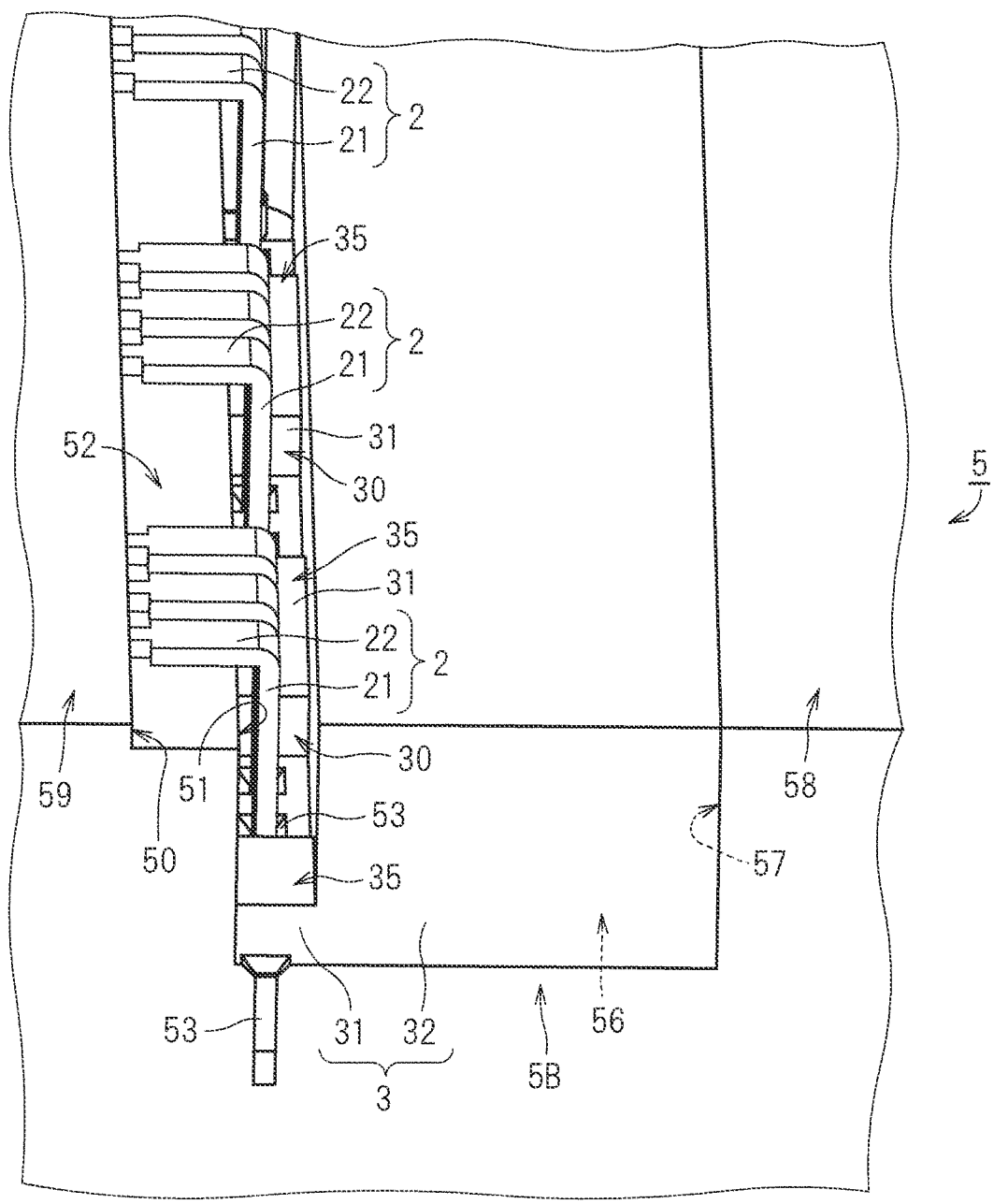
FIG. 13 is a perspective view partially illustrating the lower mold, the nest, and the terminals.

FIGS. 12 and 13 illustrate a state in which the terminals 2 are arranged after the nests 3 are arranged in the lower mold 5. FIG. 12 is a plan view illustrating the lower mold 5, the nests 3, and the terminals 2. FIG. 13 is a perspective view partially illustrating the lower mold 5, the nest 3, and the terminals 2. In FIG. 13, the cross section at the position DD in FIG. 12 appears on the front side of the sheet of paper. The directions X, Y, and Z additionally shown in FIGS. 12 and 13 correspond to the directions X, Y, and Z additionally shown in FIGS. 1 to 4 illustrating the housing 100.

Figure 14:
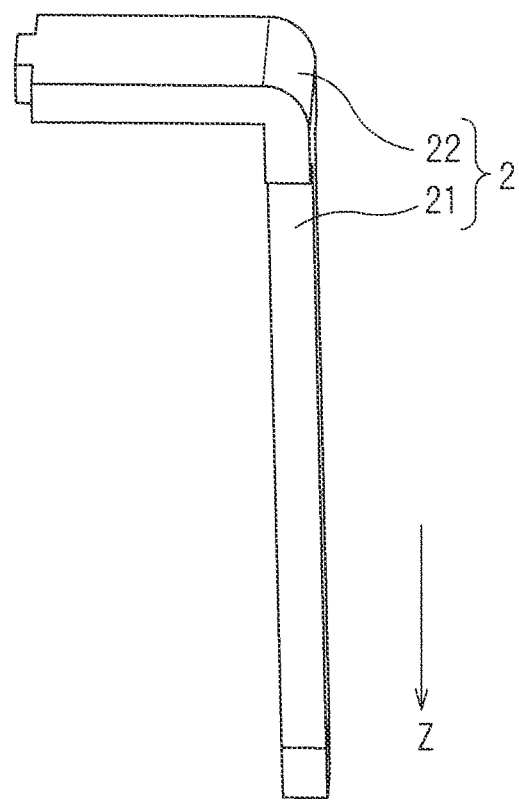
FIG. 14 is a perspective view illustrating one of the terminals.

FIG. 14 is a perspective view illustrating one of the terminals 2. The direction Z additionally shown in FIG. 14 corresponds to the direction Z additionally shown in FIGS. 1 to 4 illustrating the housing 100. Of the holes 53, the terminals 2 are inserted into the holes 53 which are not covered by the portions 31, and more specifically, the portions 21 are inserted.

When the molding is performed, no resin is introduced into the holes 53 covered by the portions 31 as well as the regions in which the portions 31 per se are located. By the portions 31, the holes 53 corresponding to the positions where the terminals 2 are not arranged are prevented from the introduction of the resin. Such prevention contributes to avoiding the molding of unnecessary resin reflecting the shape of the holes 53. The housing 100 having the recessed portions 13 reflecting the shape of the portions 31 is obtained.

Figure 15:
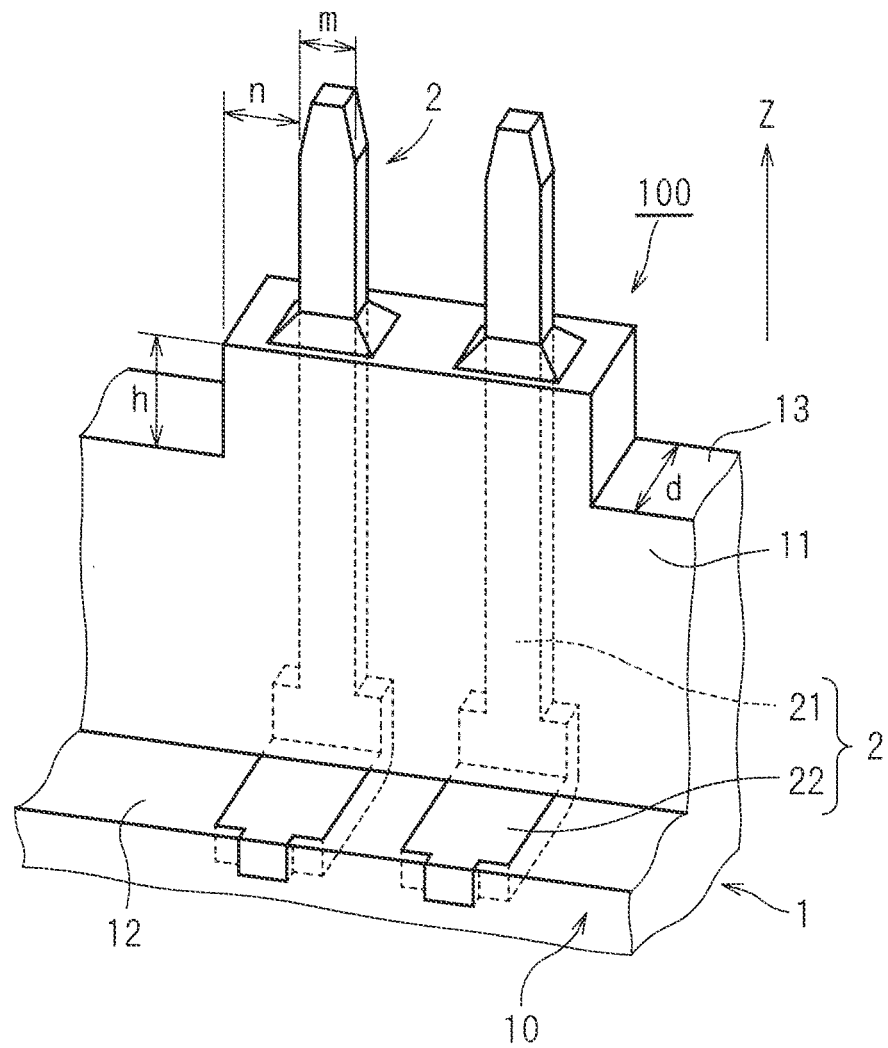
FIG. 15 is a perspective view illustrating the arrangement of the terminals in the housing.

FIG. 15 is a perspective view illustrating the arrangement of the terminals 2 in the housing 100. The direction Z additionally shown in FIG. 15 corresponds to the direction Z additionally shown in FIGS. 1 to 4 illustrating the housing 100. In FIG. 15, in order to make it easier to view the posture in which the terminals 2 are arranged, the shape of the terminals 2 embedded in the wall 11 and hidden therein are drawn by a broken line as a hidden-line.

The upper mold 6 is aligned with the lower mold 5, the nests 3 and the terminals 2 in the state illustrated in FIGS. 12 and 13, and the housing 100 in which the terminals 2 and the frame 1 are integrated by known insert molding is obtained.

Figure 16:
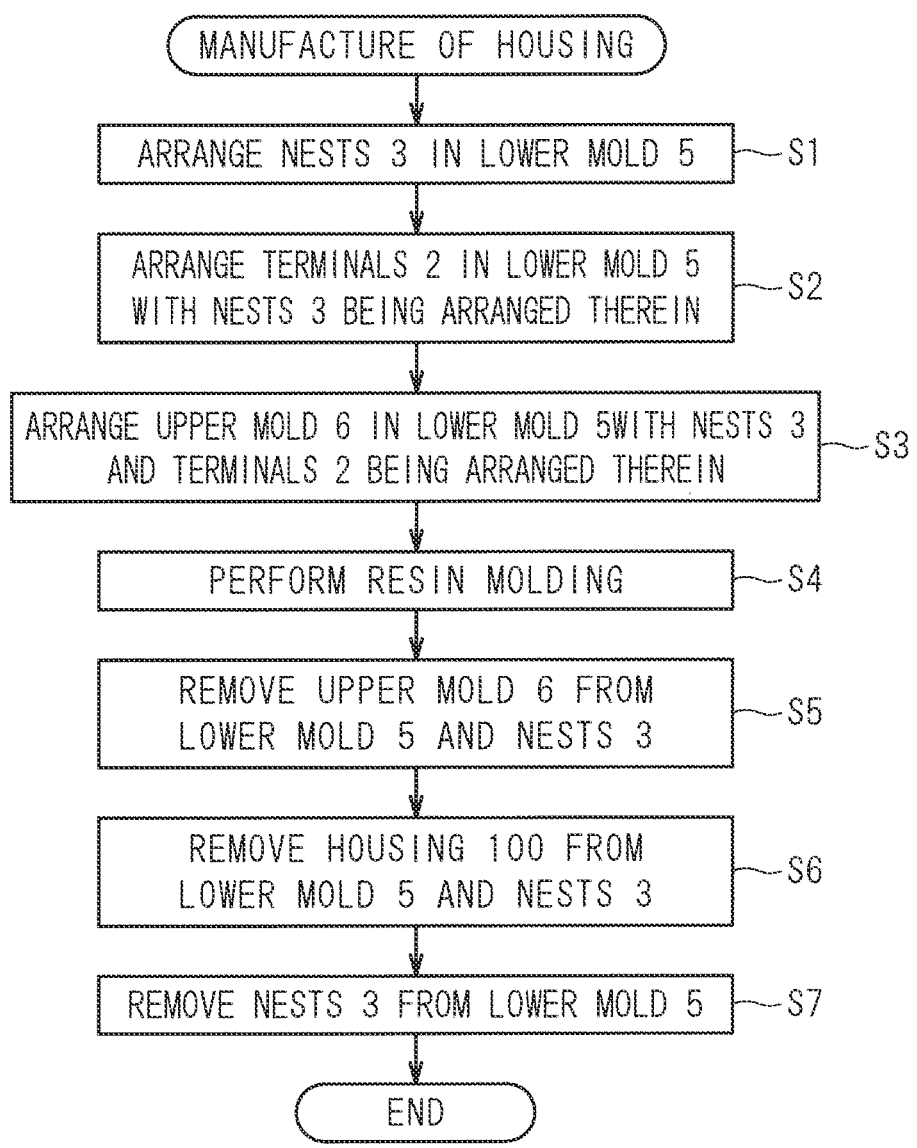
FIG. 16 is a flowchart illustrating a manufacturing process of the housing.

FIG. 16 is a flowchart illustrating a manufacturing process of the housing 100. It can be seen that the flowchart illustrates the manufacturing method of the housing 100.

Step S1 is a step of arranging the nests 3 in the lower mold 5. Specifically, Step S1 is a step of fitting the nests 3 into the recessed portions 5B. After Step S1 is completed, the terminals 2 are arranged in Step S2 in the lower mold 5 with the nests 3 being arranged therein. Specifically, the portions 21 are inserted into the holes 53 that are not covered by the portions 31 (see FIG. 8). For example, the portions 22 are in contact with the upper surface 52. In this case, the portions 22 are exposed on the direction Z side surface of the bottom 12 in the obtained housing 100.

After Step S2 is completed, the upper mold 6 is arranged on the lower mold 5 with the nests 3 and the terminals 2 being arranged therein in Step S3. Specifically, the surfaces 64, 68, and 69 are in contact with the column 54, the upper surfaces 58 and 59, respectively.

After the completion of Step S3, in Step S4, resin molding is performed using the lower mold 5 and the upper mold 6. Step S4 is specifically a step of introducing the resin into the space interposed between the lower mold 5 and the upper mold 6. Consequently, the housing 100 is obtained. After Step S4 is completed, in Step S5, the upper mold 6 is removed from the lower mold 5 and the nests 3. After Step S5 is completed, in Step S6, the housing 100 is removed from the lower mold 5 and the nests 3. After Step S6 is completed, in Step S7, the nests 3 are removed from the lower mold 5.

In order to obtain a housing 100 in which the terminals 2 are arranged differently, a nest 3 having a different shape is adopted. Specifically, the nest 3 having a portion 31 having a different shape is adopted. More specifically, the nest 3 having a portion 31 covering a hole 53 at a different position is adopted. The housing 100 with terminals 2 arranged at different positions is obtained using a different nest 3 and the common lower mold 5. By adopting a plurality of types of nests 3 having different shapes of the portion 31, housings 100 having different arrangements of terminals 2 with the common shape of the lower mold 5 are manufactured.

For example, in the lower mold 5 illustrated in FIG. 5, there are eight holes 53 located in parallel in the direction Y. In the housing 100 illustrated in FIG. 1, there are six terminals 2 located in parallel in the direction Y, and groups of the three terminals 2 are arranged with the recessed portion 13 interposed therebetween. In order to obtain such an arrangement of the terminals 2, as illustrated in FIG. 8, a nest 3 having a portion 31 covering centered two of holes 53 located in parallel in the direction Y is adopted.

For example, such a housing 100 is assumed in which there are four terminals 2 located in parallel in the direction Y, and groups of the two terminals 2 are arranged with a recessed portion 13 interposed therebetween. In order to obtain such a housing 100, a nest 3 having a portion 31 covering centered four of holes 53 located in parallel in the direction Y is adopted. The adoption of the nest 3 in which the portion 31 is different is similarly adopted for the terminals 2 located in parallel in the direction X.

When manufacturing a plurality of housings 100 in which the terminals 2 are arranged in the same manner, the replacement of the nest 3 is not required. In this case, Steps S1 to S7 are once executed to manufacture the housing 100, and then the other housings 100 are manufactured by repeating Steps S2 to S6.

<Description of Various Dimensions>

When the nest 3 fits into the recessed portion 5B, the end surface 30 is located between a first hole 53 covered by a portion 31 and a second hole 53 not covered by the portion 31 (however, the first hole 53 and the second hole 53 are adjacent to each other). The shape of the recessed portion 13 reflects the shape of the portion 31; therefore, the distance between the end surface 30 and the second hole 53 coincides with the distance L (see FIG. 9), excluding manufacturing tolerances.

The shorter the distance L, the longer the length of the portion 31 in the direction in which the holes 53 are aligned. The length of the portion 31 being long contributes to increasing the rigidity of the portion 31. The high rigidity of the portion 31 contributes to reducing the deformation of the nest 3 during insert molding. The deformation of the nest 3 being small when the insert molding is performed contributes to the suppression of the generation of burrs on the recessed portion 13 and the wall 11 around the recessed portion 13 as well as the suppression of the generation of an unintended shape.

For example, the distance L is preferably equal to or less than a half of the pitch t (see FIGS. 4 and 6). Expressed in an expression, it is desirable to satisfy $L \leq t/2$.

For example, products having a pitch t of 3.81 mm and a terminal 2 width m (see FIG. 15) of 1.15 mm are largely being produced as semiconductor devices to be used in the field of industrial semiconductors. In this case, assuming that $L=t/2$, the distance n (see FIG. 15) where the wall 11 exists from the terminal 2 to the end portion of the recessed portion 13 is $3.81/2-1.15/2=1.33$ mm.

Figure 17:
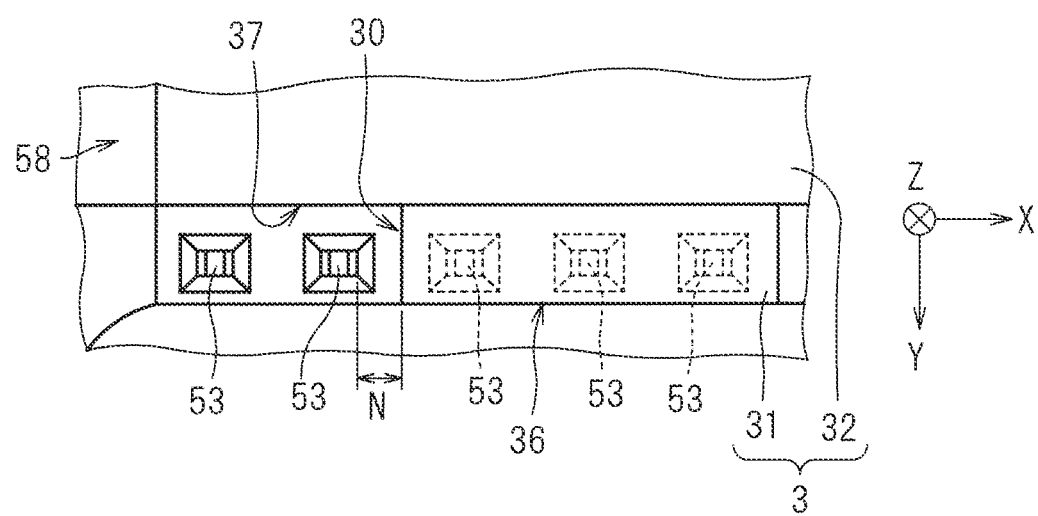
FIG. 17 is a plan view partially illustrating the nest and the lower mold.

FIG. 17 is a plan view partially illustrating the nest 3 having the portion 31 covering the three holes 53 and the lower mold 5. In FIG. 17, the distance N between a portion, in the hole 53 that is not covered by the portion 31, to which the portion 21 contacts and the end surface 30 is additionally shown. Excluding manufacturing tolerances, the distances n and N coincide with each other.

Although it depends on the resin used for the wall 11, when the distance N is thinner than 1 mm, the pressure during the molding is required to be increased. If the pressure during the molding is high, for example, this will likely raise the potential to cause such a situation that burrs will be generated or the resin will enter the gap between the nest 3 and the lower mold 5. Considering both the rigidity of the nest 3 and the moldability, the relationship of $L \leq t/2$ is desirable. However, the distance N is desired to be 0.5 mm or more; therefore, the distance L is preferably 1.0 mm or more.

Excluding manufacturing tolerances, the depth h coincides with the depth h of the portion 31 when the upper surfaces 34 and 35 are in parallel. Excluding manufacturing tolerances, the thickness d coincides with the protruding length D of the portion 31 when the side surfaces 36 and 37 are in parallel (see FIG. 9).

The ratio of the protrusion length D to the thickness H being small contributes to increasing the rigidity of the portion 31. The high rigidity of the portion 31 contributes to reducing the deformation of the nest 3 during insert molding. The deformation of the nest 3 being small when the insert molding is performed contributes to the suppression of the generation of burrs on the recessed portion 13 and the wall 11 around the recessed portion 13.

For example, the protrusion length D is desirably equal to or less than twice the thickness H. Expressed in an expression, it is desirable to satisfy $D/2 \leq H$. Excluding manufacturing tolerances, the thickness d is desirably equal to or less than twice the depth h, for example. Expressed in an expression, it is desirable to satisfy $d/2 \leq h$.

For example, products having a thickness of 2 to 3 mm are largely being produced as semiconductor devices to be used in the field of industrial semiconductors. From the viewpoint of manufacturing the nest 3, the thickness H is desirably 1 mm or more. As described above, the minimum value of the thickness d is assumed to be 2 mm, and the thickness H is desired to be 1 mm or more, so that the relationship of $d/2 \leq h$ or $D/2 \leq H$ is desirable.

<Application to Semiconductor Device>

Figure 18:
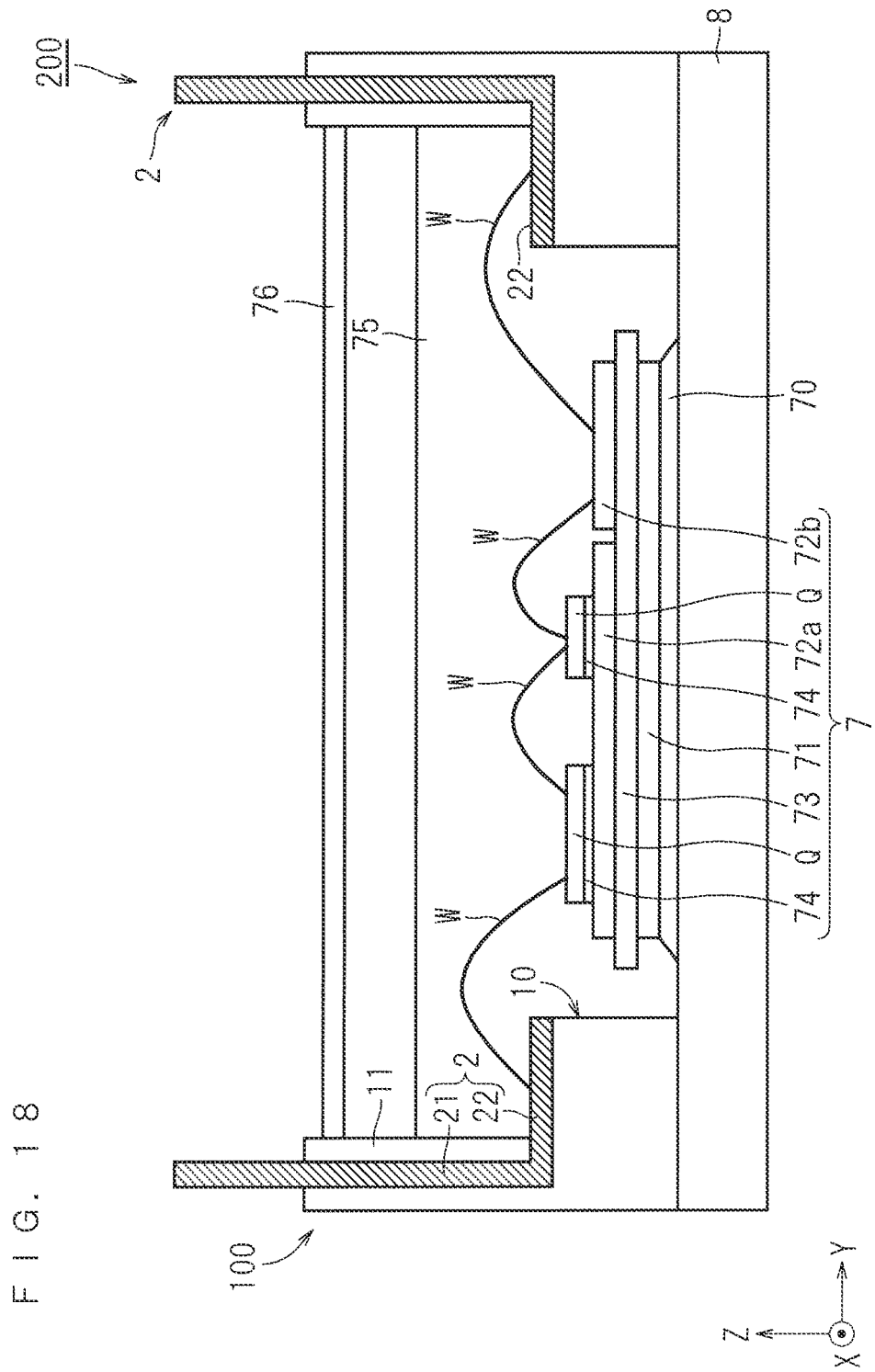
FIG. 18 is a cross-sectional view illustrating a semiconductor device.

FIG. 18 is a cross-sectional view illustrating a semiconductor device 200 provided with the housing 100. A case where the housing 100 is adopted in the semiconductor device 200 is illustrated. The housing 100 in FIG. 18 appears, for example, as a cross section at the position EE illustrated in FIG. 2. Wires W, which will be described later, are also illustrated in FIG. 18 for the better understanding of the configuration.

The semiconductor device 200 includes a housing 100, a heat radiation plate 8, a semiconductor circuit board 7, a plurality of wires W, a sealing material 75, and a lid 76. The housing 100 and the heat radiation plate 8 are connected by fasteners (not illustrated) extending through the holes 14 (see FIGS. 1 and 2). The heat radiation plate 8 is made of metal (for example, copper). Hatching is applied only to the terminals 2 of the housing 100 so as to avoid complication of drawing.

The semiconductor circuit board 7 includes at least one semiconductor element Q (a plurality of semiconductor elements Q are illustrated in FIG. 18), conductive portions 71, 72a and 72b, a substrate 73, and bonding materials 70 and 74. For example, in the semiconductor circuit board 7, a semiconductor circuit using the semiconductor element Q is formed.

The substrate 73 has an insulating property. The substrate 73 is connected to the heat radiation plate 8 via the conductive portion 71 and the bonding material 70. The substrate 73 is composed of, for example, ceramic. The bonding material 70 is, for example, solder.

Each of the conductive portions 71, 72a, and 72b is composed of, for example, copper. The conductive portion 71 is arranged on the substrate 73 on the side closer to the heat sink 8 than the substrate 73. The conductive portion 71 is connected to the heat radiation plate 8 via the bonding material 70. The conductive portions 72a and 72b are arranged on the substrate 73 on the side farther from the heat sink 8 than the substrate 73.

The semiconductor element Q is, for example, a semiconductor chip, and more specifically, for example, a power semiconductor element. The power semiconductor element is, for example, a switching element, and is exemplified by an insulated gate bipolar transistor and a field effect transistor. The power semiconductor element has a control terminal for controlling its operation. In the semiconductor device 200 provided with a plurality of semiconductor elements Q as power semiconductor elements, there are control terminals for individually controlling the semiconductor elements Q in large numbers. The housing 100 being adopted in the semiconductor device 200 is suitable for the semiconductor device 200 which has the semiconductor elements Q as the power semiconductor elements and requires a high degree of freedom in the arrangement of the control terminals.

Each of the semiconductor elements Q is mounted on the substrate 73. Each of the semiconductor elements Q is provided with a rear surface electrode (not illustrated) connected to the conductive portion 72a via the bonding material 74. Each of the rear electrodes of the semiconductor elements Q is electrically connected to the conductive portion 72a via the bonding material 74. The bonding material 74 is, for example, solder. Each of the semiconductor elements Q is provided with a front surface electrode (not illustrated) connected to a surface on the side far from the substrate 73. The number of semiconductor elements Q mounted on the substrate 73 is not limited to 2 illustrated in the drawing, and may also be 1 or 3 or more.

The terminals 2 are electrically connected to the semiconductor circuit board 7 at the portions 22 thereof. Specifically, the portion 22 is connected to, for example, the front surface electrode of the semiconductor element Q by the wire W. The portion 22 is connected to, for example, the conductive portion 72b by the wire W. The semiconductor elements Q are provided in the semiconductor device 200 together with the housing 100, and the portions 22 are connection targets for the semiconductor elements Q.

The wires W connect, for example, the front surface electrodes of a plurality of semiconductor elements Q to each other. The wire W connects, for example, the front surface electrode of the semiconductor element Q and the conductive portion 72b to each other. The wire W has conductivity and is composed of, for example, metal.

The sealing material 75 fills a region surrounded by the heat radiation plate 8 and the housing 100 by covering at least the semiconductor circuit board 7 and the portions 22. In FIG. 18, the case where the sealing material 75 also covers the wires W is illustrated. The lid 76 comes into contact with the wall 11 and covers the sealing material 75 from the side opposite to the heat radiation plate 8.

Figure 19:
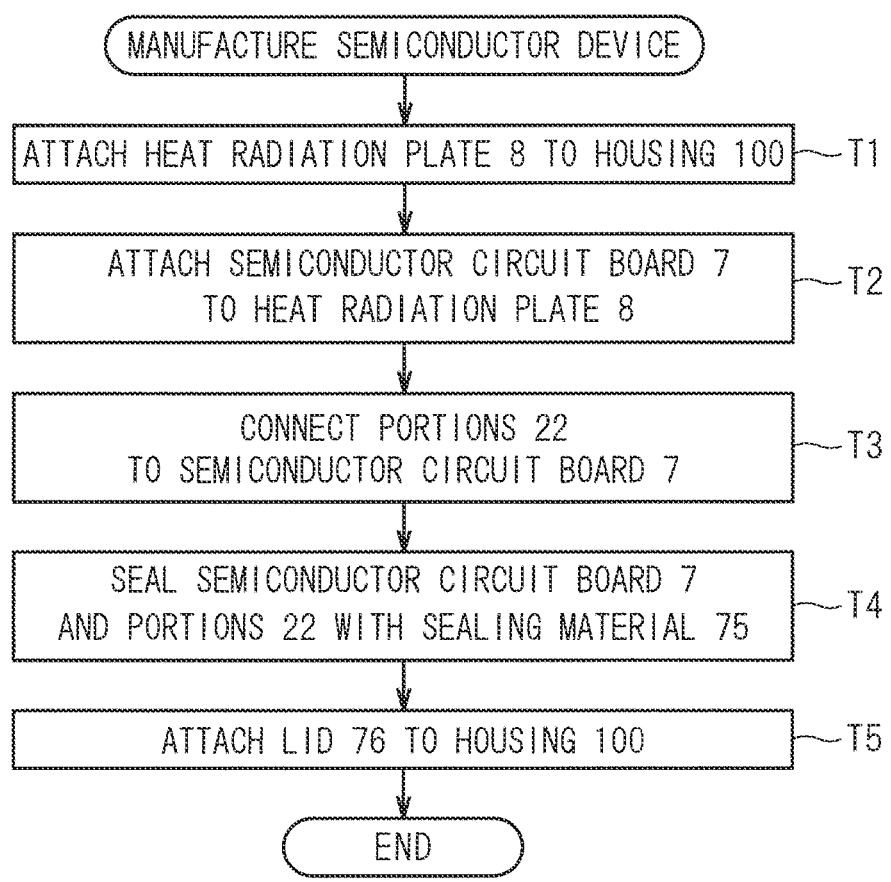
FIG. 19 is a flowchart illustrating a manufacturing process of the semiconductor device.

FIG. 19 is a flowchart illustrating a manufacturing process of the semiconductor device 200. It can be seen that the flowchart illustrates the manufacturing method of the semiconductor device 200. Step T1 is a step of attaching the heat radiation plate 8 to the housing 100. For example, the process of Step T1 is realized by using the fasteners extending through the holes 14.

After the end of Step T1, Step T2 is executed. Step T2 is a step of attaching the semiconductor circuit board 7 to the heat radiation plate 8. For example, the process of Step T2 is realized by connecting the conductive portion 71 included in the semiconductor circuit board 7 to the heat radiation plate 8 by using the bonding material 70.

After the end of Step T2, Step T3 is executed. Step T3 is a step of connecting the portions 22 to the semiconductor circuit board 7. For example, the process of Step T3 is realized by connecting the semiconductor elements Q to the portions 22 using the wires W and connecting the conductive portion 72b to the portions 22.

After the end of Step T3, Step T4 is executed. Step T4 is a step of sealing the semiconductor circuit board 7 and the portions 22 with the sealing material 75. For example, the process of Step T4 is realized by the sealing material 75 filling the region surrounded by the heat radiation plate 8 and the housing 100 with covering the semiconductor circuit board 7 and the portions 22. In Step T4, the wires W may be sealed as illustrated in FIG. 18.

After the end of Step T4, in Step T5, the lid 76 is attached to the housing 100. For example, the lid 76 comes into contact with the wall 11 and covers the sealing material 75 from the side opposite to the heat radiation plate 8.

When the execution of Step T5 is completed, the semiconductor device 200 including the housing 100, the heat radiation plate 8, the semiconductor circuit board 7, a plurality of wires W, the sealing material 75, and the lid 76 is obtained.

When the semiconductor device 200 is mounted on the printed circuit board, the printed circuit board is screwed into the holes 15 of the housing 100 included in the semiconductor device 200.

<Modification>

Figure 20:
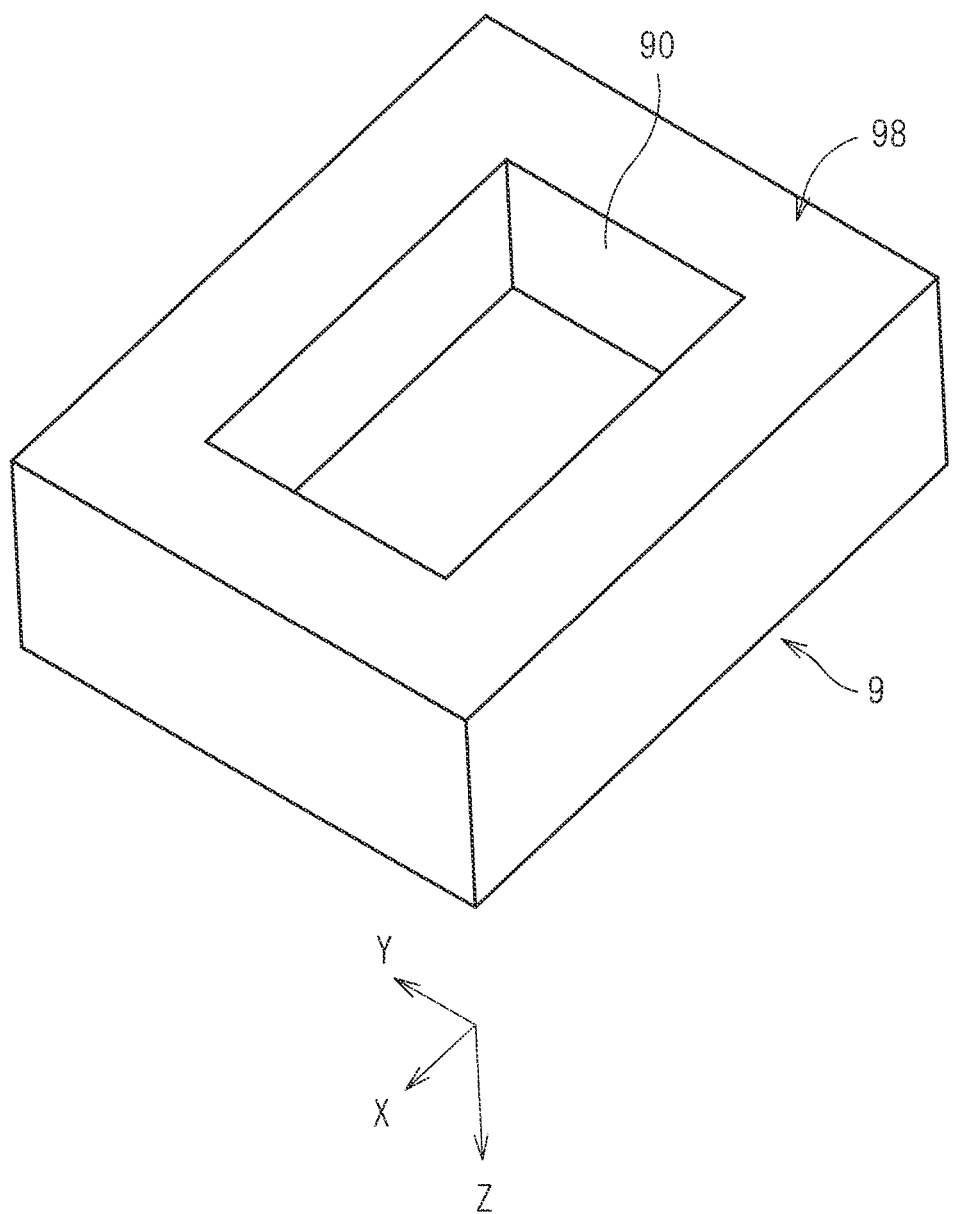
FIG. 20 is a perspective view illustrating a lower mold capable of accommodating the lower mold.
Figure 21:
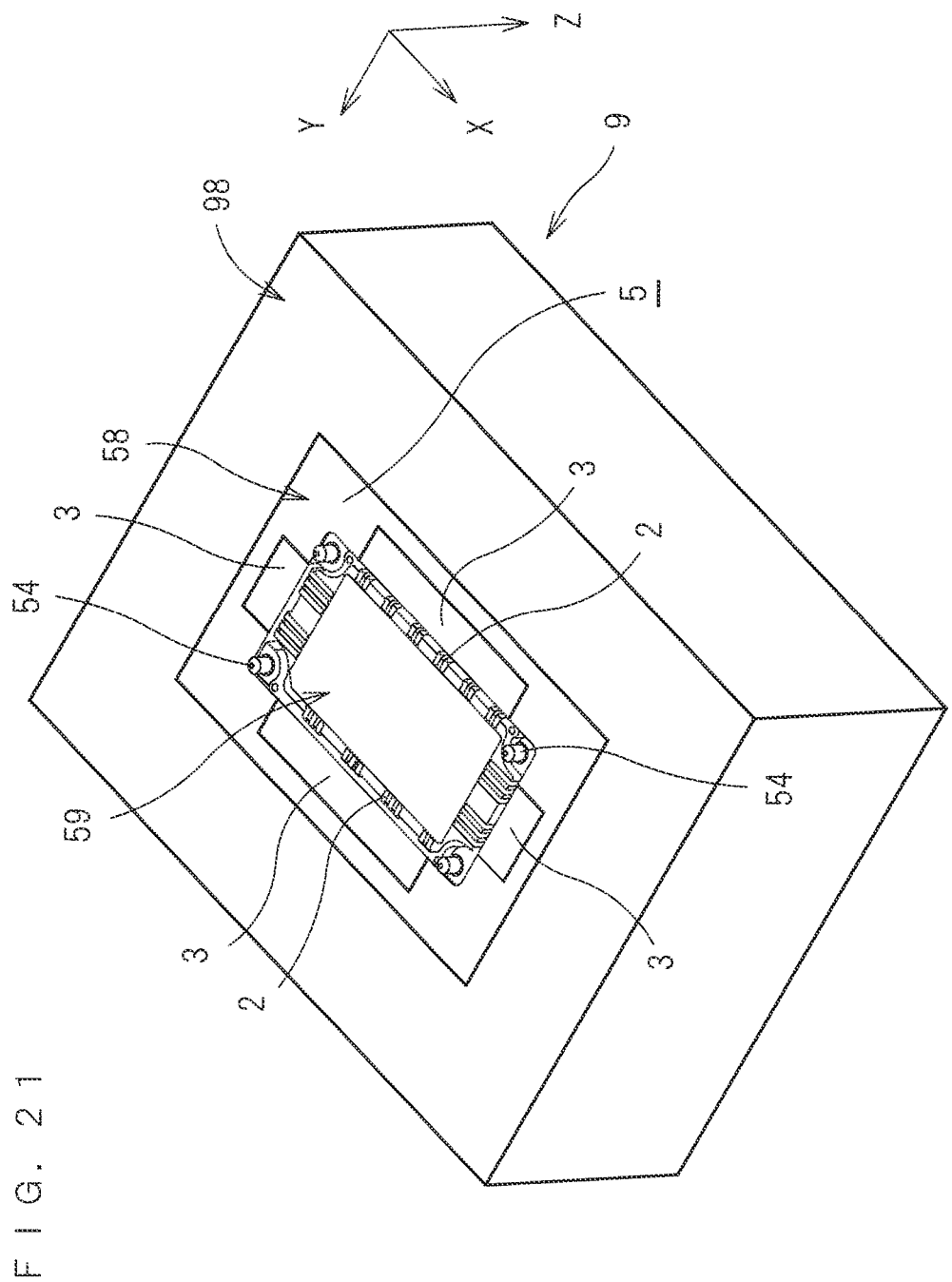
FIG. 21 is a perspective view illustrating the lower mold in a state where the terminals and the nests are arranged therein and the lower mold in a state where the lower mold in the state is accommodated therein.
Figure 22:
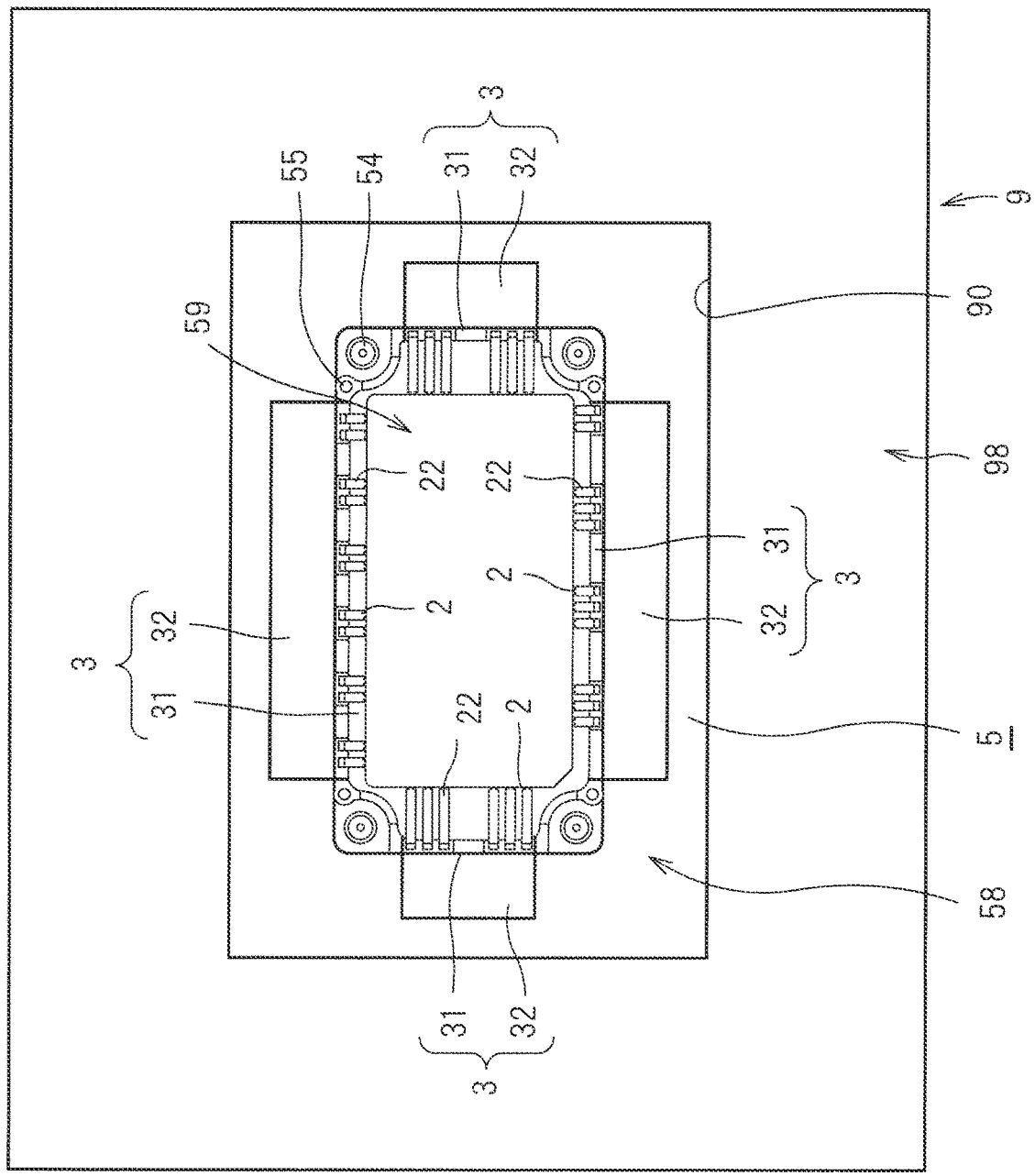
FIG. 22 is a plan view illustrating the terminals, the nests, and the lower mold.

Resin molding using another lower mold that is capable of accommodating the lower mold 5 contributes to easy replacement of the nest 3. FIG. 20 is a perspective view illustrating a lower mold 9 capable of accommodating the lower mold 9. FIG. 21 is a perspective view illustrating the lower mold 5 in a state where the terminals 2 and the nests 3 are arranged therein and the lower mold 9 in a state where the lower mold 5 in the state is accommodated therein. FIG. 22 is a plan view illustrating the terminals 2, the nests 3, and the lower molds 5 and 9 in this state. The directions X, Y, and Z additionally shown in FIGS. 20 to 22 correspond to the directions X, Y, and Z additionally shown in FIGS. 1 to 4 illustrating the housing 100.

The lower mold 9 has a flat surface 98 and a recessed portion 90. The recessed portion 90 opens in the direction (−Z). The recessed portion 90 is surrounded by the surface 98 when viewed along the direction Z.

The recessed portion 90 shows a shape capable of accommodating the lower mold 5. When the lower mold 5 is housed in the recessed portion 90, the recessed portion 90 holds the lower mold 5 to such an extent that the relative movement of the lower mold 5 with respect to the lower mold 9 in the directions X and Y is suppressed.

Excluding manufacturing tolerances, when the lower mold 5 is accommodated in the recessed portion 90, the position of the surface 98 in direction Z coincides with the upper end surface of the column 54, the upper end surface of the column 55, the position of the upper surface 58, and the position of the upper surface 59 in the direction Z.

For example, lower mold 5 is a rectangular parallelepiped. Excluding manufacturing tolerances, the length of the lower mold 5 in the direction Z coincides with the depth of the recessed portion 90 in the direction Z, the length of the lower mold 5 in the direction X coincides with the inner dimension of the recessed portion 90 in the direction X, and the length of the lower mold 5 in the direction Y coincides with the inner dimension of the recessed portion 90 in the direction Y.

Figure 23:
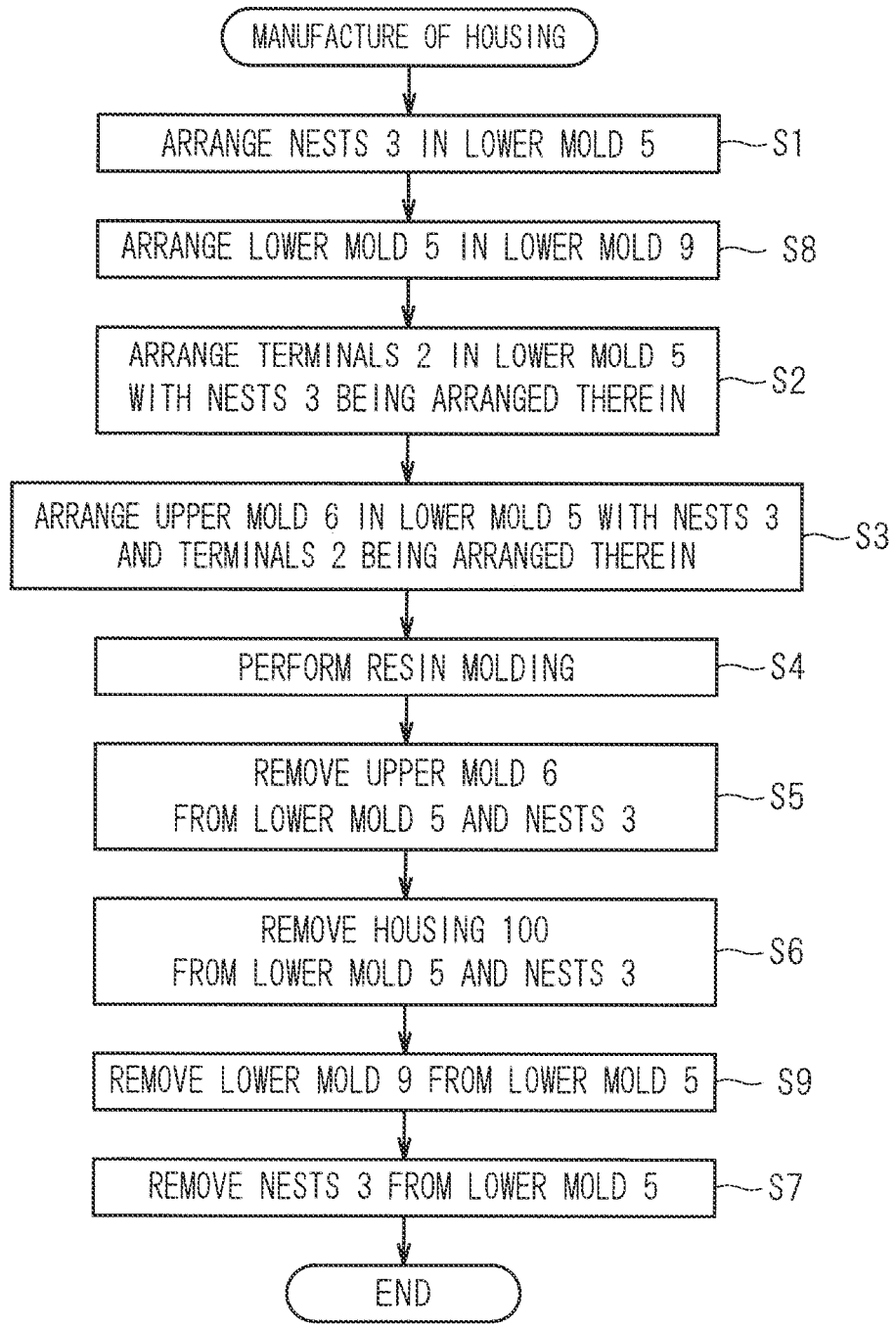
FIG. 23 is a flowchart illustrating an other manufacturing process of the housing.

FIG. 23 is a flowchart illustrating an other manufacturing process of the housing 100. Here, the "other" indicates that it is a flowchart related to Modification, unlike the flowchart of FIG. 16.

The flowchart illustrated in FIG. 23 illustrates a configuration in which Steps S8 and S9 are added to the flowchart illustrated in FIG. 16. Step S8 is a step executed between Steps S1 and S2. Step S9 is a step executed between Steps S6 and S7.

The lower mold 5 in which Step S1 is executed and the nests 3 are arranged is arranged in the lower mold 9 in Step S8. Specifically, the step of Step S8 is realized by accommodating the lower mold 5 in the recessed portion 90.

After Step S8 is executed, Steps S2 to S6 are executed as described with reference to FIG. 16. In Modification, the upper mold 6 desirably comes into contact with not only the lower mold 5 but also the lower mold 9. For example, the surface 68 of the upper mold 6 being wide along the directions X and Y to the degree that it is to make an annular contact with, at least the periphery of the recessed portion 90, of the surface 98 of the lower mold 9 when step S3 is executed is desirable.

The lower mold 5 from which the housing 100 is removed by the execution of Step S6 and in which the nests 3 are arranged therein is removed from the lower mold 9 in Step S9. Specifically, the step of Step S9 is realized by removing the lower mold 5 in this state from the recessed portion 90.

After Step S9 is executed, the nest 3 is removed from lower mold 5 in Step S7.

By using such a lower mold 9, removal of the lower mold 9 from the molding machine that performs insert molding is not required when manufacturing a plurality of types of housings 100 by differently arranging the nests 3. This reduces the time taking for exchanging the arrangement of the nest 3 when manufacturing the housing 100 of another type. Such shortening contributes to the efficiency in the housing 100 of other types.

It should be noted that Embodiment can be appropriately modified or omitted.

While the invention has been shown and described in detail, the foregoing description is in all aspects illustrative and not restrictive. It is therefore understood that numerous modifications and variations can be devised without departing from the scope of the invention.

What is claimed is:

1. A manufacturing method of a housing including a frame and a plurality of terminals insert-molded together with the frame and provided in a semiconductor device together with a semiconductor element, wherein
each of the plurality of terminals has a first portion and a second portion being a connection target for the semiconductor element, the method comprising:
a first step arranging, for a lower mold provided with a plurality of holes each of which is a target into which the first portion is inserted, a nest having a third portion covering at least one of the holes;
a second step arranging, for the lower mold with the nest being arranged therein, the plurality of terminals by inserting the first portion into a hole not covered by the third portion, the hole being at least one of the plurality of holes;
a third step arranging an upper mold on the lower mold with the nest and the plurality of terminals being arranged therein; and
a fourth step, which is executed after the third step, obtaining the housing by performing resin molding using the lower mold and the upper mold.

2. The manufacturing method of the housing for the semiconductor device according to claim 1, wherein
in a state after execution of the first step, an end surface of the third portion is located between a first of the holes covered by the third portion and a second of the holes, adjacent to the first of the holes, not covered by the third portion, and
a distance between the end surface and the second of the holes is equal to or less than a half of an interval between the first of the holes and the second of the holes.

3. The manufacturing method of the housing for the semiconductor device according to claim 1, wherein
the nest further has a fourth portion connecting a plurality of the third portions, and a length by which the third portion protrudes from the fourth portion is equal to or less than twice a length of the third portion along a direction the hole extends.

4. The manufacturing method of the housing for the semiconductor device according to claim 2, wherein
the nest further has a fourth portion connecting a plurality of the third portions, and
a length by which the third portion protrudes from the fourth portion is equal to or less than twice a length of the third portion along a direction the hole extends.

5. The manufacturing method of the housing for the semiconductor device according to claim 1, further comprising:
a fifth step, which is executed after the fourth step, removing the upper mold from the lower mold and the nest;
a sixth step, which is executed after the fifth step, removing the housing from the lower mold and the nest;
a seventh step, which is executed after the sixth step, removing the nest from the lower mold;
an eighth step, which is executed between the first step and the second step, arranging the lower mold in an other lower mold; and
a ninth step, which is executed between the sixth step and the seventh step, removing the lower mold from the other lower mold.

6. The manufacturing method of the housing for the semiconductor device according to claim 2, further comprising:
a fifth step, which is executed after the fourth step, removing the upper mold from the lower mold and the nest;
a sixth step, which is executed after the fifth step, removing the housing from the lower mold and the nest;
a seventh step, which is executed after the sixth step, removing the nest from the lower mold;
an eighth step, which is executed between the first step and the second step, arranging the lower mold in an other lower mold; and
a ninth step, which is executed between the sixth step and the seventh step, removing the lower mold from the other lower mold.

7. The manufacturing method of the housing for the semiconductor device according to claim 3, further comprising:
a fifth step, which is executed after the fourth step, removing the upper mold from the lower mold and the nest;
a sixth step, which is executed after the fifth step, removing the housing from the lower mold and the nest;
a seventh step, which is executed after the sixth step, removing the nest from the lower mold;
an eighth step, which is executed between the first step and the second step, arranging the lower mold in an other lower mold; and
a ninth step, which is executed between the sixth step and the seventh step, removing the lower mold from the other lower mold.

8. The manufacturing method of the housing for the semiconductor device according to claim 4, further comprising:
a fifth step, which is executed after the fourth step, removing the upper mold from the lower mold and the nest;
a sixth step, which is executed after the fifth step, removing the housing from the lower mold and the nest;
a seventh step, which is executed after the sixth step, removing the nest from the lower mold;
an eighth step, which is executed between the first step and the second step, arranging the lower mold in an other lower mold; and
a ninth step, which is executed between the sixth step and the seventh step, removing the lower mold from the other lower mold.

* * * * *